US012684942B2

(12) United States Patent
Bang et al.

(10) Patent No.: US 12,684,942 B2
(45) Date of Patent: Jul. 14, 2026

(54) LIGHT EMITTING DISPLAY APPARATUS

(71) Applicant: LG Display Co., Ltd., Seoul (KR)

(72) Inventors: Sungjin Bang, Paju-si (KR);
JungHyun Ham, Paju-si (KR);
Taeseong Han, Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 854 days.

(21) Appl. No.: 17/973,497

(22) Filed: Oct. 25, 2022

(65) Prior Publication Data

US 2023/0189556 A1     Jun. 15, 2023

(30) Foreign Application Priority Data

Dec. 14, 2021     (KR) ........................ 10-2021-0178618

(51) Int. Cl.
*H10K 50/856*     (2023.01)
*H10K 50/80*     (2023.01)
(Continued)

(52) U.S. Cl.
CPC ......... *H10K 50/856* (2023.02); *H10K 50/868*
(2023.02); *H10K 59/353* (2023.02); *H10K*
*59/38* (2023.02)

(58) Field of Classification Search
CPC .. H10K 50/856; H10K 50/868; H10K 50/353;
H10K 50/841; H10K 50/86;
(Continued)

(56) References Cited

U.S. PATENT DOCUMENTS 8,615,151 B2     12/2013     Rinko
10,692,938 B2     6/2020     Kim
(Continued)

FOREIGN PATENT DOCUMENTS

KR     10-2009-0110294 A     10/2009
KR     10-2017-0051775 A     5/2017
(Continued)

OTHER PUBLICATIONS

Korean Intellectual Property Office, Office Action, Korean Patent
Application No. 10-2021-0178618, May 21, 2025, 15 pages.

*Primary Examiner* — Steven B Gauthier
*Assistant Examiner* — Adam D Weiland
(74) *Attorney, Agent, or Firm* — Fenwick & West LLP

(57)     ABSTRACT

A light emitting display apparatus comprises a substrate
comprising a light emitting surface and a plurality of pixels
having an emission area; a pixel circuit layer comprising a
plurality of insulating layers over the substrate; a protection
layer disposed over the pixel circuit layer; a light extraction
portion over the protection layer in the emission area, the
light extraction portion comprising a plurality of concave
portions, and a convex portion between the plurality of
concave portions; a light emitting device layer on the light
extraction portion, the light emitting device layer configured
to emit light to the light emitting surface; and a light guide
surface at one of the plurality of insulating layers and the
protection layer at each of the plurality of pixels, the light
guide surface is inclined with respect to the light emitting
surface while overlapping with the emission area.

19 Claims, 19 Drawing Sheets

(51) Int. Cl.
    *H10K 59/35*       (2023.01)
    *H10K 59/38*       (2023.01)

(58) Field of Classification Search
    CPC ......... H10K 50/85–865; H10K 50/852; H10K
               50/858; H10K 59/353; H10K 59/38;
            H10K 59/879; H10K 59/8791; H10K
                59/124; H10K 59/131; H10K
            2102/3023–3035; G09G 2300/0456;
                            H05B 33/24
    See application file for complete search history.

(56)                     References Cited

U.S. PATENT DOCUMENTS

| | | | |
|---|---|---|---|
| 10,923,684 B2 | 2/2021 | Park et al. | |
| 2008/0186736 A1 | 8/2008 | Rinko | |
| 2015/0001477 A1* | 1/2015 | Namkung ............ | H10K 59/124 |
| | | | 257/40 |
| 2015/0236076 A1* | 8/2015 | Sim ...................... | H10K 59/122 |
| | | | 438/34 |
| 2017/0125742 A1 | 5/2017 | Park et al. | |
| 2018/0182827 A1 | 6/2018 | Kim | |
| 2019/0066546 A1* | 2/2019 | Kato ................... | H10K 59/878 |
| 2020/0058721 A1* | 2/2020 | Sim ...................... | H10K 50/856 |
| 2021/0135167 A1 | 5/2021 | Park et al. | |
| 2021/0210727 A1* | 7/2021 | Fukagawa .......... | H10K 59/8731 |

FOREIGN PATENT DOCUMENTS

| | | |
|---|---|---|
| KR | 10-2018-0073793 A | 7/2018 |
| KR | 10-2018-0075958 A | 7/2018 |

* cited by examiner

LIGHT EMITTING DISPLAY APPARATUS

CROSS-REFERENCE TO RELATED APPLICATION

This application claims the benefit of and priority to Republic of Korea Patent Application No. 10-2021-0178618 filed on Dec. 14, 2021, which is hereby incorporated by reference in its entirety.

TECHNICAL FIELD

The present disclosure relates to a light emitting display apparatus.

DISCUSSION OF THE RELATED ART

A light emitting display apparatus has a high response speed and has low power consumption. Unlike a liquid crystal display apparatus, the light emitting display apparatus is a self-emitting display apparatus and does not require a separate light source. Thus, there is no problem in the viewing angle, whereby the light emitting display apparatus is subject to a next generation flat panel display apparatus.

The light emitting display apparatus displays an image through light emitting of a light emitting device layer including a light emitting layer interposed between two electrodes.

However, since some of the light emitted from the light emitting device layer is not emitted to the outside due to a total reflection at the interface between the light emitting device layer and the electrode and/or a total reflection at the interface between the substrate and the air layer, the light extraction efficiency is reduced. Accordingly, light emitting display apparatus has problems in that brightness is lowered due to low light extraction efficiency, and power consumption increases.

SUMMARY

Accordingly, the present disclosure is directed to providing a light emitting display apparatus that substantially obviates one or more problems due to limitations and disadvantages of the related art.

An aspect of the present disclosure is to provide a light emitting display apparatus that can enhance light extraction efficiency of light which is emitted from a light emitting portion.

An aspect of the present disclosure is to provide a light emitting display apparatus capable of reducing a degradation of black visibility characteristics caused by a reflection of external light.

The objects of the present disclosure are not limited to the aforesaid, but other objects not described herein will be clearly understood by those skilled in the art from descriptions below.

According to an aspect of the present disclosure, the above and other objects can be accomplished by the provision of a light emitting display apparatus comprising a substrate comprising a light emitting surface and a plurality of pixels having an emission area; a pixel circuit layer comprising a plurality of insulating layers over the substrate; a protection layer disposed over the pixel circuit layer; a light extraction portion over the protection layer in the emission area, the light extraction portion comprising a plurality of concave portions, and a convex portion between the plurality of concave portions; a light emitting device layer on the light extraction portion, the light emitting device layer configured to emit light to the light emitting surface; and a light guide surface at one of the plurality of insulating layers and the protection layer at each of the plurality of pixels, the light guide surface is inclined with respect to the light emitting surface while overlapping with the emission area.

According to another aspect of the present disclosure, there is provided a light emitting display apparatus comprising a substrate comprising a light emitting surface and a plurality of pixels, a light extraction portion over the substrate, the light extraction portion comprising a plurality of concave portions, and a convex portion between the plurality of concave portions, a light emitting device layer over the light extraction portion, the light emitting device layer comprising an emission layer and a light reflection surface, and a light guide surface between the light emitting surface and the light reflection surface, the light guide surface may be inclined with respect to the light emitting surface.

In the light emitting display apparatus according to the present specification, the light extraction efficiency of light which is emitted from a light emitting portion may be improved.

In the light emitting display apparatus according to the present disclosure, the degradation of black visibility characteristics by the reflection of external light may be reduced, thereby a real black in a non-driving or turning-off state may realize.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
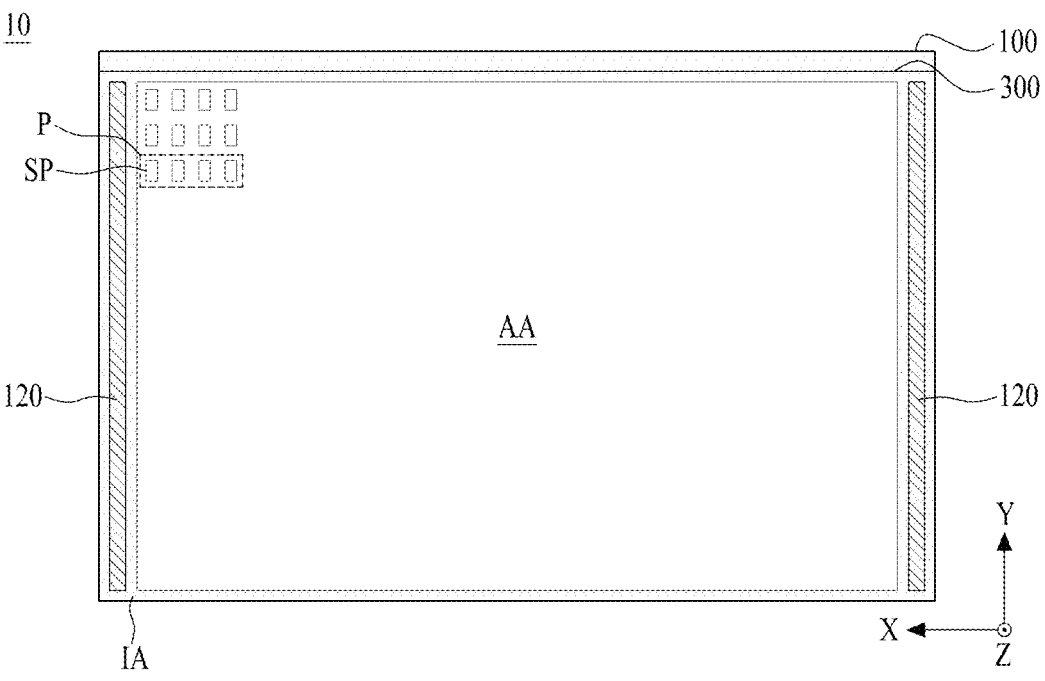
FIG. 1 is a view schematically illustrating a light emitting display apparatus according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present disclosure are used, another part can be added unless 'only-' is used. The terms in a singular form may include plural forms unless noted to the contrary.

In construing an element, the element is construed as including an error range although there is no explicit description.

In describing a positional relationship, for example, when a position relation between two parts is described as 'on-', 'over-', 'under-' and 'next-', one or more other parts can be disposed between the two parts unless 'just' or 'direct' is used.

It will be understood that, although the terms "first," "second," and the like can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element or layer is "connected," "coupled," or "adhered" to another element or layer means that the element or layer can not only be directly connected, coupled, or adhered to another element or layer, but also be indirectly connected, coupled, or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in a co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

FIG. 1 is a view schematically illustrating a light emitting display apparatus according to an embodiment of the present disclosure.

Referring to FIG. 1, a light emitting display apparatus according to an embodiment of the present disclosure may include a display panel 10 and a panel driving circuit.

The display panel 10 may include a substrate 100 and a counter substrate 300 which are bonded to each other.

The substrate 100 includes a thin film transistor, and the substrate 100 may be a first substrate, a lower substrate, a transparent glass substrate, or a transparent plastic substrate. The substrate 100 may include a display area AA and a non-display area IA.

The display area AA is an area for displaying an image. The display area AA may be a pixel array area, an active area, a pixel array portion, or a screen. For example, the display area AA may be disposed at a central area of the display panel 10. The display area AA may include a plurality of pixels P.

A plurality of pixels P may each be defined as a unit area from which light is actually emitted. Each of the plurality of pixels P may include a plurality of subpixels SP. According to an embodiment, each of the plurality of pixels P may include at least one red subpixel, at least one green subpixel, at least one blue subpixel, and at least one white subpixel, but is not limited thereto. For example, each of the plurality of pixels P may include a red subpixel, a green subpixel, a blue subpixel, and a white subpixel. Sizes of a plurality of subpixels SP included in each of the plurality of pixels P may be equal or different.

The non-display area IA is an area in which an image is not displayed. The non-display area IA may be a peripheral circuit area, a signal supply area, a non-active area, or a bezel area. The non-display area IA may be configured to surround the display area AA. The display panel 10 or substrate 100 may further include a peripheral circuit portion 120 disposed at the non-display area IA.

The peripheral circuit portion 120 may include a gate driving circuit connected to the plurality of pixels P. The gate driving circuit (or panel embedded gate driving circuit) may be integrated at one side or both sides of the non-display area IA of the substrate 100 according to a manufacturing process of a thin film transistor and may be connected to the plurality of pixels P. For example, the gate driving circuit may include a shift register already known in the art.

The counter substrate 300 may encapsulate (or seal) the display area AA disposed over the substrate 100. For example, the counter substrate 300 may be bonded to the substrate 100 by using an adhesive member (or transparent adhesive). The counter substrate 300 may be an upper substrate, a second substrate, or an encapsulation substrate.

Figure 2:
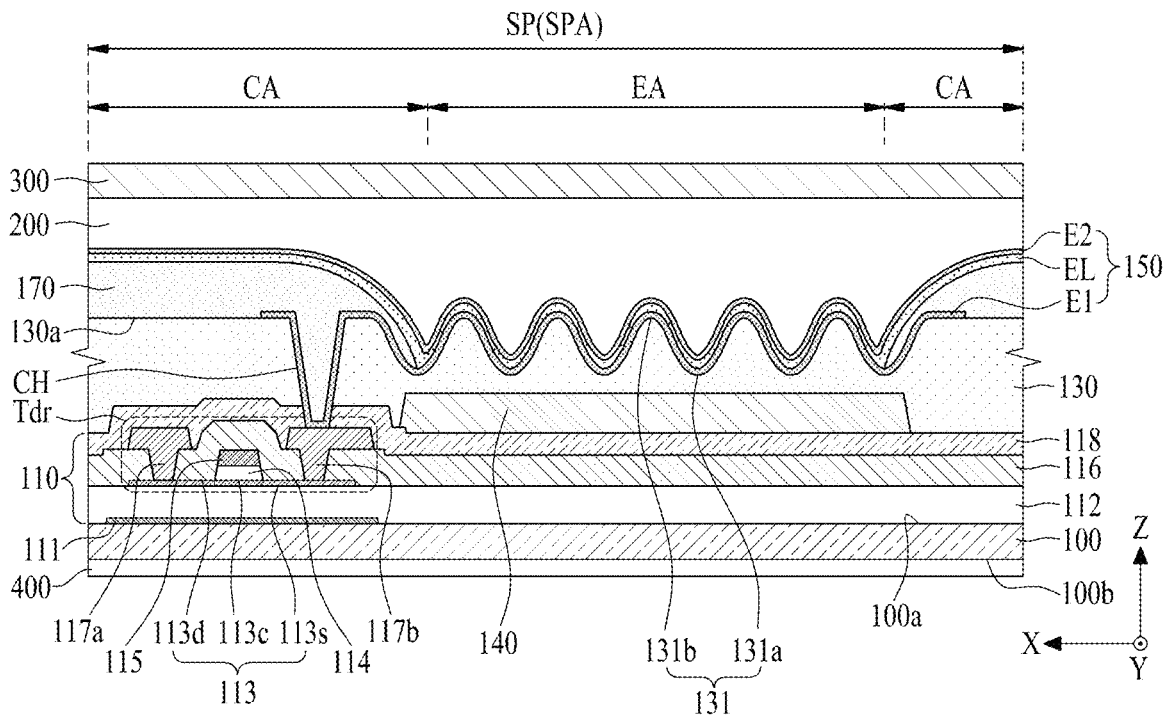
FIG. 2 is a cross-sectional view illustrating one pixel shown in FIG. 1 according to an embodiment of the present disclosure.

FIG. 2 is a cross-sectional view illustrating one pixel shown in FIG. 1 according to one embodiment.

Referring to FIG. 2, the light emitting display apparatus (or a light emitting display panel) according to an embodiment of the present disclosure may include a plurality of subpixels SP.

Each of the plurality of subpixels SP may be disposed in each of the plurality of subpixel areas SPA disposed in the pixel P. Each of the plurality of subpixel areas SPA according to an embodiment may include a circuit area CA and an emission area EA. The circuit area CA may be spatially separated from the emission area EA within the subpixel area SPA, but is not limited thereto. For example, at least a portion of the circuit area CA may overlap with the emission area EA in the subpixel area SPA. For example, the circuit area CA may overlap the emission area EA within the subpixel area SPA, or may be disposed under (or below) the emission area EA within the subpixel area SPA. The emission area EA may be an opening region, a light emitting region, a light transmitting region, or a light transmitting portion. For example, the circuit area CA may be a non-emission region or a non-opening region. The subpixel area SPA according to another embodiment may further include a transparent portion (or a light transmitting portion) disposed around at least one of the emission area EA and the circuit area CA. For example, the one pixel P may include an emission area for each pixel corresponding to each of the plurality of subpixels SP, and a transparent portion (or a light transmitting portion) disposed around each of the plurality of subpixels SP. In this case, the light emitting display apparatus may implement a transparent light emitting display apparatus due to light transmission of the transparent portion.

The light emitting display apparatus (or a light emitting display panel) according to an embodiment of the present disclosure may include a pixel circuit layer 110, a protection layer 130, and a light emitting device layer 150 which are disposed over the substrate 100.

The pixel circuit layer 110 may include a buffer layer 112, a pixel circuit, and a passivation layer 118.

The buffer layer 112 may be disposed at the entirety of a first surface (or a front surface) 100a of the substrate 100. The buffer layer 112 may prevent or at least reduce materials contained in the substrate 100 from spreading to a transistor layer during a high-temperature process in the manufacturing of the thin film transistor, or may prevent external water or moisture from permeating into the light emitting device layer 150. For example, the buffer layer 112 may be a first insulating layer, a first inorganic material layer or a lowermost insulating layer from among a plurality of insulating layers disposed at the pixel circuit layer of the substrate 100.

The pixel circuit may include a driving thin film transistor Tdr disposed in a circuit area CA of each pixel P (or each subpixel SP). The driving thin film transistor Tdr may include an active layer 113, a gate insulting layer 114, a gate electrode 115, an interlayer insulating layer 116, a drain electrode 117a, and a source electrode 117b.

The active layer 113 may be configured with a semiconductor material based on any one of amorphous silicon, polycrystalline silicon, oxide, and organic materials.

The gate insulating layer 114 may be formed over a channel region 113c of the active layer 113. As an embodiment, the gate insulating layer 114 may be formed at an island shape over the channel region 113c of the active layer 113, or may be formed over the entire front surface of the buffer layer 112 or substrate 100 including the active layer 113. For example, when the gate insulating layer 114 is formed at the entire front surface of the buffer layer 112, the gate insulating layer 114 may be a second insulating layer, a second inorganic material layer or a lowermost middle insulating layer from among a plurality of insulating layers disposed at the pixel circuit layer of the substrate 100.

The gate electrode 115 may be disposed over a gate insulating layer 114 to overlap a channel region 113*c* of an active layer 113.

The interlayer insulating layer 116 may be formed over the gate electrode 115, and a drain region 113*d* and a source region 113*s* of the active layer 113. The interlayer insulating layer 116 may be formed at the entire front surface of the buffer layer 112 or substrate 100. For example, the interlayer insulating layer 116 may be a third insulating layer, a third inorganic material layer or an upper insulating layer from among a plurality of insulating layers disposed at the pixel circuit layer of the substrate 100.

The drain electrode 117*a* may be disposed over the interlayer insulating layer 116 to be electrically connected to the drain region 113*d* of the active layer 113. The source electrode 117*b* may be disposed over the interlayer insulating layer 116 to be electrically connected to the source region 113*s* of the active layer 113.

The pixel circuit may further include first and second switching thin film transistors and at least one capacitor which are disposed at the circuit area CA together with the driving thin film transistor Tdr. The light emitting display apparatus according to an embodiment of the present disclosure may further include a light shielding layer 111 provided under (or below) at least one active layer 113 from among the driving thin film transistor Tdr, a first switching thin film transistor, and a second switching thin film transistor. The light shielding layer 111 may be configured to reduce or prevent a change in a threshold voltage of the thin film transistor caused by external light.

The passivation layer 118 may be disposed over the substrate 100 to cover (or overlay) the pixel circuit. For example, the passivation layer 118 may be configured to cover (or overlay) the drain electrode 117*a* and the source electrode 117*b* of the driving thin film transistor Tdr and the interlayer insulating layer 116. For example, the passivation layer 118 may be formed of an inorganic insulating material. The passivation layer 118 may be a fourth insulating layer, a fourth inorganic material layer or an uppermost middle insulating layer from among a plurality of insulating layers disposed at the pixel circuit layer of the substrate 100.

The protection layer 130 may be provided over the substrate 100 to cover (or overlay) the pixel circuit layer 110. The protection layer 130 may be provided at the entire display area and the remaining portions of the non-display area except the pad area. For example, the protection layer 130 may include an extension portion (or expansion portion) extended or expanded from the display area to the remaining portions of the non-display area except the pad area. Accordingly, the protection layer 130 may have a relatively large size than the display area.

The protection layer 130 according to an embodiment has a relatively large thickness so that the protection layer 130 may provide a planarized surface 130*a* over the pixel circuit layer 110. For example, the protection layer 130 may be formed of an organic material such as photo acrylic, benzocyclobutene, polyimide, and fluorine resin, but are not limited thereto. The protection layer 130 may be a fifth insulating layer, a fifth inorganic material layer or an uppermost insulating layer from among a plurality of insulating layers disposed at the pixel circuit layer of the substrate 100, or may be a planarization layer or overcoat layer.

The protection layer 130 may include a light extraction portion 131 disposed at each pixel P. The light extraction portion 131 may be formed at an upper surface 130*a* of the protection layer 130 such that the light extraction portion 131 overlaps with an emission area EA of a subpixel area SPA. The light extraction portion 131 is formed at the protection layer 130 of the emission area EA to have a curved shape (or an uneven shape), whereby a progress path of light emitted from the light emitting device layer 150 is changed to increase light extraction efficiency of the pixel P. For example, the light extraction portion 131 may be referred to as an uneven pattern portion, a micro lens, or a light scattering pattern.

The light extraction portion 131 may include a plurality of concave portions 131*a*, and a convex portion 131*b* disposed around each of the plurality of concave portions 131*a*. Each of the plurality of concave portions 131*a* may be formed or implemented to be concave from the upper surface 130*a* of the protection layer 130. The convex portion 131*b* may be disposed between the plurality of concave portions 131*a*. The convex portion 131*b* may be formed to surround each of the plurality of concave portions 131*a*.

A top portion of the convex portion 131*b* may have a convex curved shape. For example, the top portion of the convex portion 131*b* may include a dome or bell structure having a convex cross-sectional shape, but is not limited thereto. For example, the convex portion 131*b* may include a sharp structure having a sharp tip to enhance light extraction efficiency of the pixel.

The convex portion 131*b* may include an inclined portion having a curved shape between a bottom portion and the top portion. The inclined portion of the convex portion 131*b* may form or implement the concave portion 131*a*. For example, the inclined portion of the convex portion 131*b* may be an inclined surface or a curved portion. The inclined portion of the convex portion 131*b* according to an embodiment may have a cross-sectional structure having Gaussian curve. In this case, the inclined portion of the convex portion 131*b* may have a tangent slope which increases progressively from the bottom portion to the top portion, and then decreases progressively.

The light emitting device layer 150 may be disposed over the light extraction portion 131 overlapping with the emission area EA. The light emitting device layer 150 may be configured to emit the light toward the substrate 100 according to a bottom emission type. The light emitting device layer 150 according to an embodiment may include a first electrode E1, a light emitting layer EL, and a second electrode E2.

The first electrode E1 may be formed over the protection layer 130 in the subpixel area SPA, and may be electrically connected to the source electrode 117*b* of the driving thin film transistor Tdr. One end of the first electrode E1 which is close to the circuit area CA may be electrically connected to the source electrode 117*b* of the driving thin film transistor Tdr via an electrode contact hole CH provided at or passing through the protection layer 130 and the passivation layer 118.

The first electrode E1 directly contacts the light extraction portion 131 and thus, may have a shape conforming (or matching) to the shape of the light extraction portion 131. As the first electrode E1 is formed (or deposited) over the protection layer 130 to have a relatively small thickness, the first electrode E1 may have a surface morphology conforming (or matching) to a surface morphology (or first surface shape) of the light extraction portion 131 including the convex portion 131*b* and the plurality of concave portions 131*a*. For example, the first electrode E1 is formed in a conformal shape based on the surface shape (morphology) of the light extraction portion 131 by a deposition process of a transparent conductive material, whereby the first electrode E1 may have a cross-sectional structure whose shape is the same as the light extraction portion 131.

The light emitting layer EL may be formed over the first electrode E1 and may directly contact the first electrode E1. As the light emitting layer EL is formed (or deposited) over the first electrode E1 to have a relatively large thickness in comparison to the first electrode E1, the light emitting layer EL may have a surface morphology (or third surface shape) which is different from the surface morphology in each of the plurality of concave portions 131a and the convex portion 131b or the surface morphology of the first electrode E1. For example, the light emitting layer EL may be formed in a non-conformal shape which does not conform to the surface shape (or morphology) of the first electrode E1 by a deposition process, whereby the light emitting layer EL may have a cross-sectional structure whose shape may be different from the first electrode E1.

The light emitting layer EL according to an embodiment has a thickness that gradually increases toward the bottom surface of the convex portion 131b or the concave portion 131a. For example, the light emitting layer EL may be formed of a first thickness over the top portion of the convex portion 131b, may be formed of a second thickness that is thicker than the first thickness over the bottom surface of the concave portion 131a, and may be formed over an inclined surface (or a curved portion) of the convex portion 131b to have a third thickness that is less than the first thickness. Herein, the first, second, and third thicknesses may be the shortest distance between the first electrode E1 and the second electrode E2 over the top portion of the convex portion 131b, the bottom surface of the concave portion 131a and the inclined surface (or a curved portion) of the convex portion 131b, respectively.

The light emitting layer EL includes two or more organic light emitting layers configured to emit white light. As an example, the light emitting layer EL may include a first organic light emitting layer and a second organic light emitting layer to emit white light by mixing a first light and a second light. For example, the first organic light emitting layer may include any one selected from among a blue organic light emitting layer, a green organic light emitting layer, a red organic light emitting layer, a yellow organic light emitting layer, and a yellow-green organic light emitting layer to emit the first light. For example, the second organic light emitting layer may include an organic light emitting layer capable of emitting the second light to obtain white light in the light emitting layer EL by mixing the first light of a blue organic light emitting layer, a green organic light emitting layer, a red organic light emitting layer, a yellow organic light emitting layer, or a yellow-green organic light emitting layer. The light emitting layer EL according to another embodiment may include any one selected from among a blue organic light emitting layer, a green organic light emitting layer, and a red organic light emitting layer. Additionally, the light emitting layer EL may include a charge generating layer interposed between the first organic light emitting layer and the second organic light emitting layer.

The second electrode E2 may be formed at the light emitting layer EL and may directly contact the light emitting layer EL. The second electrode E2 may be formed (or deposited) at the light emitting layer EL to have a relatively smaller thickness compared to the light emitting layer EL. The second electrode E2 may be formed (or deposited) at the light emitting layer EL to have a relatively small thickness, and thus may have a surface morphology corresponding to the surface morphology of the light emitting layer EL. For example, the second electrode E2 may be formed in a conformal shape corresponding to the surface shape (or morphology) of the light emitting layer EL by a deposition process, whereby the second electrode E2 may have the same cross-sectional structure as the light emitting layer EL.

The second electrode E2 according to an embodiment may include a metal material having a high reflectance to reflect the incident light emitted from the light emitting layer EL toward the substrate 100. For example, the second electrode E2 may include a single-layered structure or multi-layered structure of any one material selected from among aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba). The second electrode E2 may include an opaque conductive material having high reflectance. For example, the second electrode E2 may include a light reflection surface or a light reflective portion.

As described above, the light emitting device layer 150 may generate light responsive to current supplied thereto through the pixel circuit and thus, may emit the light. The concave portion 131a or the convex portion 131b of the light extraction portion 131 changes the traveling path of the light emitted from the light emitting layer EL to the light emitting surface (or light extraction surface) 100b, to thereby increase the external extraction efficiency of the light emitted from the light emitting layer EL. For example, the convex portion 131b prevents or reduces degradation of the light extraction efficiency caused by the light which is trapped in the light emitting device layer 150 by repeating total reflection between the first electrode E1 and the second electrode E2 of the light emitting device layer 150 without traveling to the light emitting surface 100b.

The light emitting display apparatus according to an embodiment of the present disclosure may further include a bank layer 170. The bank layer 170 may be disposed over an edge portion of the first electrode E1 and the protection layer 130. The bank layer 170 may be formed of an organic material such as benzocyclobutene (BCB)-based resin, acrylic-based resin, polyimide resin, or the like. For example, the bank layer 170 may be formed of a photosensitizer including a black pigment. In this case, the bank layer 170 may also function as a light shielding member between the adjacent pixels.

The bank layer 170 may be disposed over the upper surface 130a of the protection layer 130 to cover (or overlay) the edge portion of the first electrode E1 extending onto the circuit area CA. The emission area EA defined by the bank layer 170 may be smaller in size than the light extraction portion 131 of the protection layer 130 in a two-dimensional structure.

The light emitting layer EL of the light emitting device layer 150 may be provided over the first electrode E1, the bank layer 170, and a step difference portion between the first electrode E1 and the bank layer 170. In this case, when the light emitting layer EL is provided with a small thickness at the step difference portion between the first electrode E1 and the bank layer 170, an electrical contact (or short) may occur between the second electrode E2 and the first electrode E1 due to a thickness reduction of the light emitting layer EL. To prevent this problem, one end (or an outermost bank line) of the bank layer 170 adjacent to the emission area EA may be disposed to cover (or overlay) the edge portion of the light extraction portion 131 to reduce a step difference between the first electrode E1 and the bank layer 170. Therefore, the electric contact (or short) between the first electrode E1 and the second electrode E2 may be prevented due to the end of the bank layer 170 disposed at the step portion between the first electrode E1 and the bank layer 170.

The light emitting display apparatus according to the embodiment of the present disclosure may further include a color filter layer 140.

The color filter layer 140 may be disposed between the substrate 100 and the protection layer 130 to overlap with at least one emission area EA. The color filter layer 140 according to an embodiment may be disposed between the passivation layer 118 and the protection layer 130 to overlap with the emission area EA. The color filter layer 140 according to another embodiment may be disposed between the substrate 100 and the interlayer insulating layer 116 or between the interlayer insulating layer 116 and the passivation layer 118 to overlap with the emission area EA.

The color filter layer 140 may have a larger size than the emission area EA. For example, the color filter layer 140 may be larger than the emission area EA, and may be smaller than the light extraction portion 131 of the protection layer 130, but is not limited thereto, and the color filter layer 140 may be larger than the light extraction portion 131. For example, when the color filter layer 140 has a greater size than the light extraction portion 131, light leakage through which internal light travels toward the adjacent subpixel SP may be reduced or minimized.

The color filter layer 140 according to an embodiment may include a color filter which transmits the wavelength of a color set in the subpixel SP from among the light emitted (or extracted) from the light emitting device layer 150 toward the substrate 100. For example, the color filter layer 140 may transmit the red wavelength, green wavelength, or blue wavelength. When the one pixel comprises adjacent first to fourth subpixels SP, the color filter layer provided at the first subpixel may include a red color filter, the color filter layer provided at the second subpixel may include a green color filter, and the color filter layer provided at the third subpixel may include a blue color filter. The fourth subpixel may not include a color filter layer or may include a transparent material to compensate a step difference between adjacent pixels, thereby emitting white light.

The light emitting display apparatus (or the light emitting display panel) according to the embodiment of the present disclosure may include an encapsulation portion 200.

The encapsulation portion 200 may be formed over substrate 100 to cover (or overlay) the light emitting device layer 150. The encapsulation portion 200 may be formed over substrate 100 to cover (or overlay) the second electrode E2. For example, the encapsulation portion 200 may surround the display area. The encapsulation portion 200 may protect the thin film transistor and the light emitting layer EL or the like from external impact and prevent oxygen or/and water (or moisture) and particles from being permeated into the light emitting layer EL.

The encapsulation portion 200 according to an embodiment may include a plurality of inorganic encapsulation layer. Furthermore, the encapsulation portion 200 may further include at least one organic encapsulation layer interposed between the plurality of inorganic encapsulation layer. The organic encapsulation may be expressed as a particle overlay layer.

The encapsulation portion 200 according to another embodiment may further include a filler (or a filling member) completely surrounding the entire display area. In this case, the counter substrate 300 may be bonded to the substrate 100 by using the filler. The filler may include a getter material that absorbs oxygen or/and water (or moisture).

The counter substrate 300 may be coupled to the encapsulation portion 200. The counter substrate 300 may be made of a plastic material, a glass material, or a metal material. For example, when the encapsulation portion 200 includes a plurality of inorganic encapsulation layers, the counter substrate 300 will be omitted.

Alternatively, when the encapsulation portion 200 is changed to a filler, the counter substrate 300 may be combined with the filler, in this case, the counter substrate 300 may be made of a plastic material, a glass material, or a metal material.

The light emitting display apparatus (or the light emitting display panel) according to an embodiment of the present disclosure may further include a polarization member 400.

The polarization member 400 may be configured to block external light reflected by the light extraction portion 131 and the pixel circuit, or the like. For example, the polarization member 400 may be configured as a circular polarization member or a circular polarization film. The polarization member 400 may be disposed at or coupled to the light emitting surface (or a second surface or a rear surface) 100b of the substrate 100 by using a coupling member (or a transparent adhesive member).

As described above, the light emitting display apparatus (or the light emitting display panel) according to the embodiment of the present disclosure includes the light extraction portion 131 disposed or implemented in the emission area EA of the subpixel SP, and thus, the path of light generated from the emission layer EL may be changed by the light extraction portion 131 to enhance light extraction efficiency, thereby improving luminance and reducing power consumption.

Figure 3:
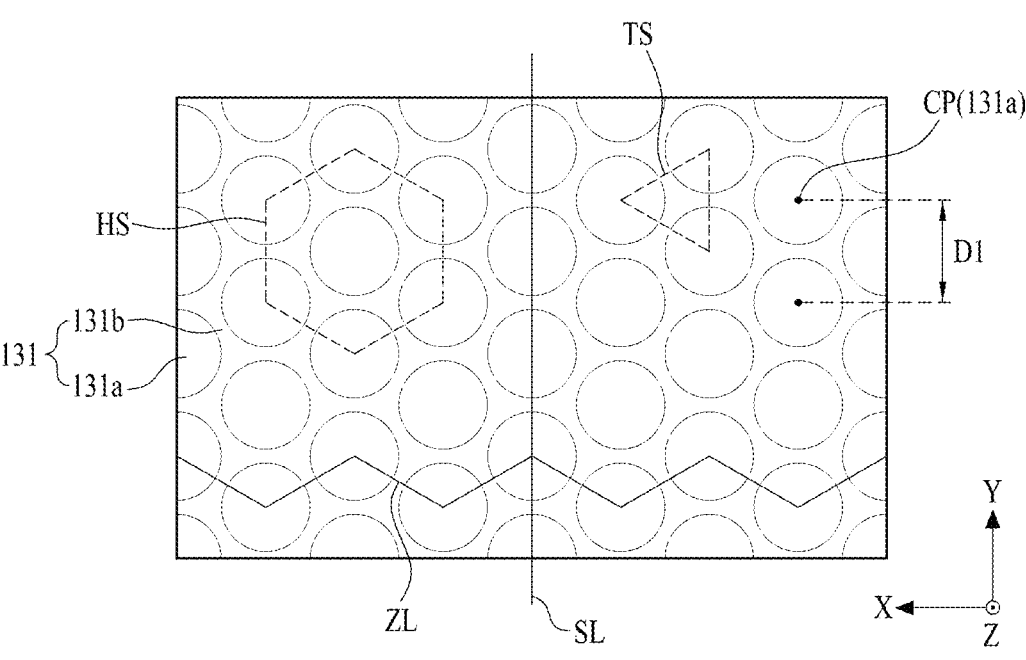
FIG. 3 is a plan view illustrating a portion of a light extraction portion shown in FIG. 2 according to an embodiment of the present disclosure.

FIG. 3 is a plan view illustrating a portion of a light extraction portion shown in FIG. 2 according to one embodiment. FIG. 3 is a view explaining planar structures of the concave portions and the convex portions.

Referring to FIGS. 2 and 3, the plurality of concave portions 131a according to an embodiment of the present disclosure may be disposed in parallel to have a predetermined interval along a second direction Y while being alternately arranged (or misaligned) from one another along a first direction X intersecting the second direction Y. Thus, the light extraction portion 131 may include a larger number of concave portions 131a per unit area, thereby increasing the external extraction efficiency of the light emitted from the light emitting device layer 150.

According to an embodiment, a central portion of each of the plurality of concave portions 131a disposed along the second direction Y may be positioned or aligned in a straight line SL parallel to the second direction Y. In addition, each center portion CP of a plurality of concave portions 131a disposed along the first direction X may be disposed at or aligned with a zigzag line ZL having a zigzag shape along the first direction X.

According to another embodiment, the plurality of concave portions 131a are disposed in the form of a lattice (or a grid) such that each of a plurality of concave portions 131a disposed at an even horizontal line parallel to the second direction Y may be disposed between a plurality of concave portions 131a disposed at odd horizontal lines adjacent to the even horizontal line along the first direction X.

According to an embodiment, the central portion CP of each of the adjacent three concave portions 131a may be aligned to form a triangular shape TS. In addition, the central portion CP of each of the six concave portions 131a disposed around one concave portion 131a or surrounding one concave portion 131a may have a 6-angular shape HS. For example, each of the plurality of concave portions 131a may be disposed or arranged in a honeycomb structure, a hexagonal structure, or a circular structure in two-dimensionally.

According to an embodiment of the present disclosure, a pitch (or a distance) D1 between the plurality of concave portions 131a disposed in each of the plurality of subpixels SP configuring the one pixel may be equal or different from each other. Here, the pitch D1 between the plurality of concave portions 131a may be the same as a distance (or an interval) between the central portions CP of the adjacent two concave portions 131a.

According to an embodiment, the pitch D1 between the plurality of concave portions 131a respectively disposed at a red subpixel, a green subpixel, a blue subpixel and a white subpixel may be equal or different from each other. For example, the pitch D1 between the plurality of concave portions 131a disposed at the green subpixel may be different from the pitch D1 between the plurality of concave portions 131a disposed at the blue subpixel.

As an embodiment, the pitch D1 between the plurality of concave portions 131a disposed at the white subpixel and/or the green subpixel may be different from the pitch D1 between the plurality of concave portions 131a disposed at the red subpixel and/or the blue subpixel.

As another embodiment, the numbers and/or densities of the plurality of concave portions 131a respectively disposed at the red subpixel, the green subpixel, the blue subpixel and the white subpixel may be equal or different from each other. For example, the numbers and/or density of the plurality of concave portions 131a disposed at the white subpixel and/or the green subpixel may be different from the number and/or density of the plurality of concave portions 131a disposed at the red subpixel and/or the blue subpixel.

The convex portion 131b may be implemented to individually surround each of the plurality of concave portions 131a. The convex portion 131b surrounding one concave portion 131a may two-dimensionally have a hexagonal shape (or a honeycomb shape).

Figure 4:
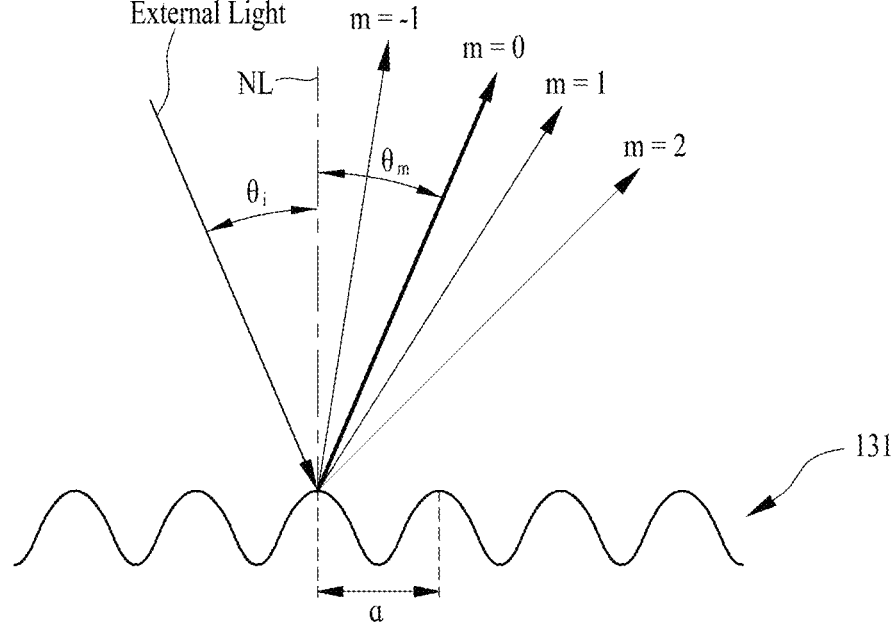
FIG. 4 is a view illustrating a reflection phenomenon of external light caused by a light extraction portion in a light emitting display apparatus according to an embodiment of the present disclosure.

FIG. 4 is a view illustrating a reflection phenomenon of external light caused by a light extraction portion in a light emitting display apparatus according to an embodiment of the present disclosure.

Referring to FIGS. 2 and 4, when external light is incident upon the light extraction portion 131 in a non-driving or turning-off state of the light emitting display apparatus, reflected light may be generated by the convex portion (or the curved portion) of the light extraction portion 131, and may then be emitted to the outside through the light emitting surface according to a birefringence effect of a thin film. Such reflected light may generate a rainbow pattern (or a rainbow stain pattern) which has a rainbow color and spreads in a radial form due to the light distribution characteristics according to the difference between material characteristics of the light emitting device layer 150 and the difference in refractive angle for each wavelength caused by the difference in refractive index for each layer. For example, the reflected light may generate a rainbow pattern in a radial form according to destructive interference and/or constructive interference of light, to thereby degrade black visibility characteristics. For example, the diffraction dispersion spectrum according to diffraction orders m (m=−1, m=0, m=1, and m=2) of reflected light by the convex portion of the light extraction portion 131, which serves as a diffraction grating pattern, is regularly arranged according to the reflection diffraction grating rule (or equation), whereby the rainbow pattern of the radial form may be generated. The rainbow pattern of the radial form may spread in a radial shape with respect to the convex portion of the light extraction portion 131, and the size and intensity of the light (or diffraction dispersion spectrum) diffracted according to the reflection diffraction grating rule expressed by the following Expression 1 may be varied according to a pitch of the convex portion of the light extraction portion 131.

$$\alpha(\sin\theta_i + \sin\theta_m) = m\lambda(m=0,\pm1,\pm2,\pm3,\dots) \qquad \text{[Expression 1]}$$

In Expression 1, "$\alpha$ (alpha)" represents a pitch of the convex portion (or a grating constant), "$\theta_i$" represents an angle (or an angle of incidence) of incident light with respect to a normal line NL, "$\theta_m$" represents an angle (or a diffraction angle) of diffracted light with respect to the normal line NL, "m" represents a diffraction order, and "$\lambda$ (lambda)" represents wavelength.

Thus, through the various experiments, the inventors of the present disclosure have invented a light emitting display apparatus having a new structure which may suppress or minimize generation of the rainbow pattern of the radial form, thereby achieving an enhancement in black visibility characteristics. This will be described below with reference to FIGS. 5 to 25B.

Figure 5:
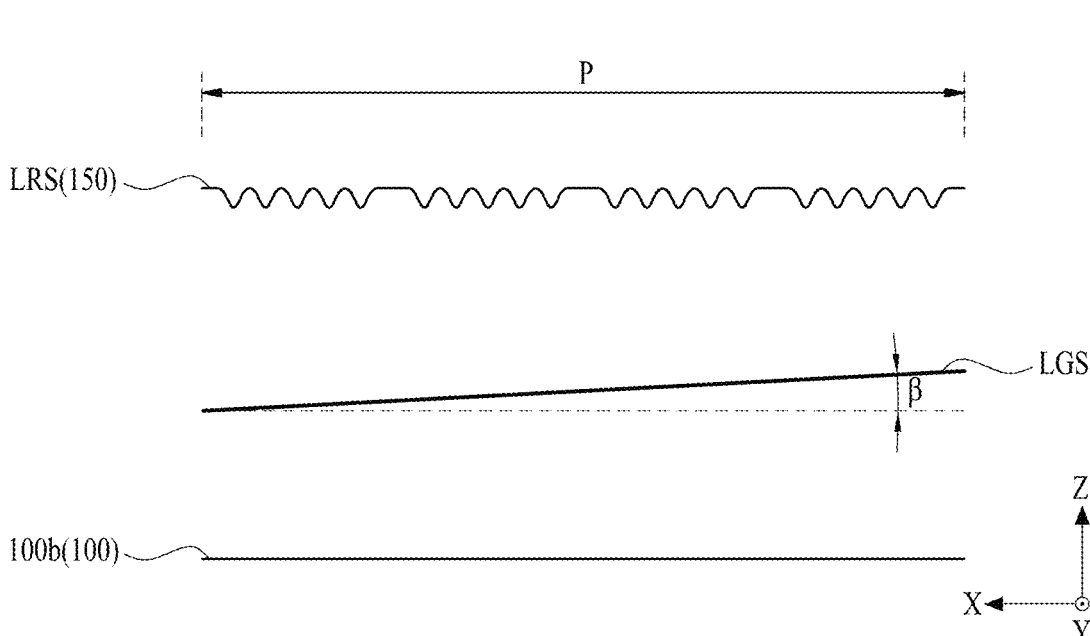
FIG. 5 is a view schematically illustrating a light emitting display apparatus according to another embodiment of the present disclosure.

FIG. 5 is a view schematically illustrating a light emitting display apparatus according to another embodiment of the present disclosure.

Referring to FIGS. 2 and 5, a light emitting display apparatus according to another embodiment of the present disclosure may include a light guide surface LGS disposed between a light emitting surface 100b of a substrate 100 and a light reflection surface LRS of a light emitting device layer 150. The light emitting surface 100b may be a second surface of the substrate 100. The light reflection surface LRS may be an interface between a light emitting layer EL and a second electrode E2 of the light emitting device layer 150. Thus, the second electrode E2 may include the light reflection surface LRS.

The light guide surface LGS may be disposed or implemented to be inclined between the light emitting surface 100b and the light reflection surface LRS. The light guide surface LGS may be implemented to have a predetermined inclination with respect to the light emitting surface 100b. For example, the light guide surface LGS may be inclined or tilted at a predetermined angle β with reference to the light emitting surface 100b implemented in the form of a planar surface. Thus, the light guide surface LGS may be referred to as a light guide portion, a light guide pattern, an inclined portion, an inclined surface, a pixel inclination portion, a pixel inclination surface, an inclination pattern, a tilt pattern, a blazed diffraction grating, a transmission type diffraction grating, or the like.

The light guide surface LGS may overlap with an emission area EA of each of a plurality of pixels P. For example, the light guide surface LGS may overlap with only an emission area EA of each of a plurality of pixels P, but is not limited thereto, and the light guide surface LGS may overlap with a portion of a circuit area CA adjacent to the emission area EA. In each of the plurality of pixels P, the light guide surface LGS may be disposed at a path along which light emitted from the light emitting device layer 150 is extracted to the light emitting surface 100b.

The light guide surface LGS may be formed at one of a plurality of insulating layers disposed between the substrate 100 and the light emitting device layer 150. According to an embodiment, the light guide surface LGS may be formed at one of the buffer layer 112 (or the gate insulating layer 114), the interlayer insulating layer 116, the passivation layer 118, and the first surface 100*a* of the substrate 100, as shown in FIG. 2. The light guide surface LGS may be inclined to have a first angle β from the light emitting surface 100*b* with reference to a first direction X or may be inclined to have a second angle from the light emitting surface 100*b* with reference to a second direction Y. The first angle β and the second angle of the light guide surface LGS may be equal or different from each other. The first angle β of the light guide surface LGS may be greater than the second angle. For example, the first direction X may be a long-side lengthwise direction, a widthwise direction or a horizontal direction of a display panel. The second direction Y may be a short-side lengthwise direction, a lengthwise direction or a vertical direction of the display panel.

The light guide surface LGS functions as a blazed grating for reflected light incident thereupon after being reflected by the light extraction portion 131 and, as such, generates a diffraction pattern (or a transmission type diffraction pattern) at a particular diffraction order other than a 0-th diffraction order according to destructive interference and/or constructive interference of the light. For example, the light guide surface LGS may generate a diffraction pattern at a particular diffraction order other than a 0-th diffraction order by changing a diffraction path of reflected light incident upon the light guide surface LGS from the light extraction portion 131 or changing a diffraction order with a maximum intensity through a blazed grating effect according to a blaze angle β with respect to the light emitting surface 100*b*. Thus, the diffraction pattern generated by the light guide surface LGS may overlap with or may be mixed with a diffraction pattern generated through a reflection diffraction grating effect (or function) of the light extraction portion 131 and, as such, the diffraction pattern (or the diffraction pattern distribution) generated by the light extraction portion 131 may be offset or reduced. Accordingly, generation of a rainbow pattern in a radial form due to the light extraction portion 131 may be suppressed or minimized and, as such, it may be possible to reduce degradation in black visibility characteristics occurring due to reflection of external light by the light extraction portion 131. Therefore, the light emitting display apparatus including the light guide surface LGS may realize real black in a non-driving or turning-off state thereof.

Figure 6:
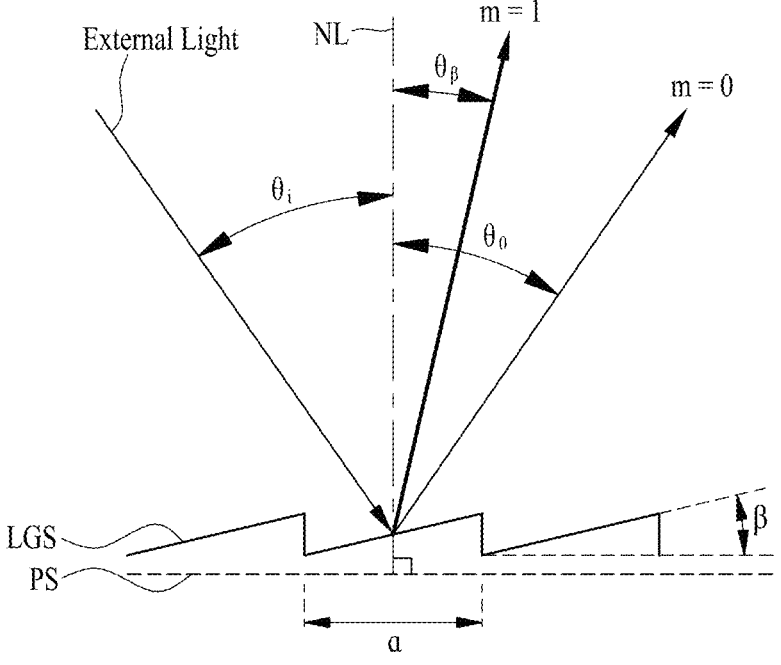
FIG. 6 is a view explaining a blazed grating effect generated by a light guide surface shown in FIG. 5 according to an embodiment of the present disclosure.

FIG. 6 is a view explaining a blazed grating effect generated by a light guide surface shown in FIG. 5 according to one embodiment.

Referring to FIGS. 3 to 6, when a light beam incident in a normal line (NL) direction perpendicular to a planar surface PS is reflected by the inclined light guide surface LGS, the reflection angle thereof may be equal to two times the inclination angle (or the blaze angle) β of the light guide surface LGS (2β). That is, light incident at an inclination equal to the inclination angle β of the light guide surface LGS is reflected in a state of being inclined at an angle equal to the inclination angle β of the light guide surface LGS. Accordingly, when the angle of incidence and the reflection angle of light incident upon the light guide surface LGS inclined with respect to the normal line NL perpendicular to the planar surface PS and the spacing (or the pitch) α of the light guide surface LGS are used, diffraction of the light (or the light beam) may be expressed by the following Expression 2.

$$\alpha(\sin(-2\beta)) \propto m\lambda) \qquad \text{[Expression 2]}$$

Thus, the light guide surface LGS functioning as a blazed grating performs incidence of light and reflection of light depending on the inclination angle (or the blaze angle) β and, as such, maximum reflection may not be generated at the 0-th diffraction order, but may be generated at a particular diffraction order other than the 0-th diffraction order. For example, as shown in FIG. 6, the inclination angle (or the blaze angle) β of the light guide surface LGS according to the embodiment of the present disclosure may be implemented such that maximum reflection is generated at a first diffraction order rather than the 0-th diffraction order, without being limited thereto, and, as such, may be implemented such that maximum reflection is generated at a particular diffraction order other than the 0-th diffraction order. As a result, the diffraction pattern generated by the light guide surface LGS may overlap with or may be mixed with a diffraction pattern generated through a reflection diffraction grating effect (or function) of the light extraction portion 131 and, as such, the diffraction pattern (or the diffraction pattern distribution) generated by the light extraction portion 131 may be offset or minimized. Accordingly, generation of a rainbow pattern in a radial form due to the light extraction portion 131 may be suppressed or minimized.

Figure 7:
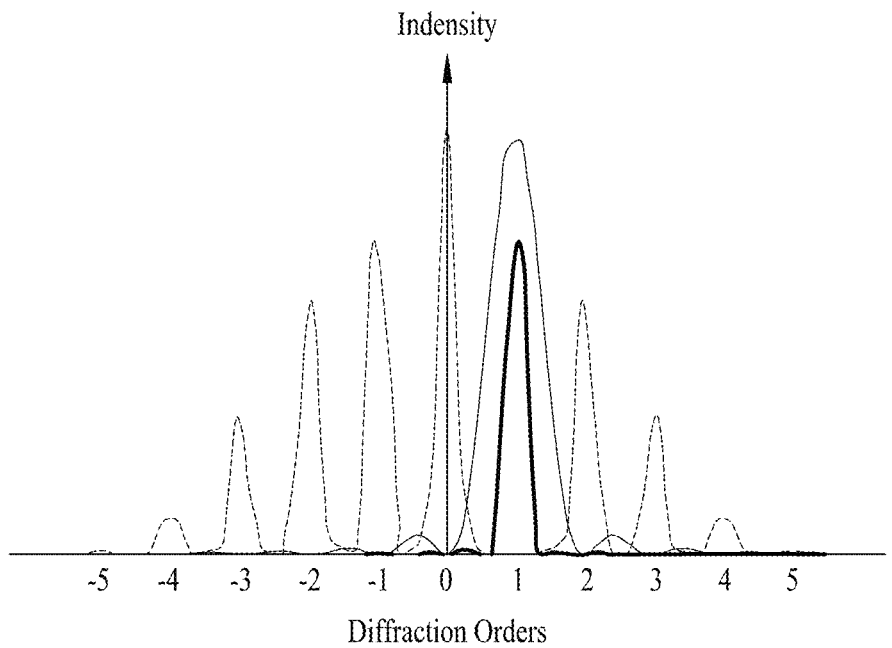
FIG. 7 is a view illustrating intensities according to diffraction orders of diffraction patterns generated by a light extraction portion and a light guide surface in a light emitting display apparatus according to an embodiment of the present disclosure.

FIG. 7 is a view illustrating intensities according to diffraction orders of diffraction patterns generated by a light extraction portion and a light guide surface in a light emitting display apparatus according to an embodiment of the present disclosure. In FIG. 7, a dotted line indicates an intensity of a diffraction pattern generated by the light extraction portion for each diffraction order, and a solid line indicates an intensity of a diffraction pattern generated by the light guide surface for each diffraction order, and a thick solid line indicates an intensity for each diffraction order of a diffraction pattern offset by overlap of the diffraction pattern generated by the light extraction portion and the diffraction pattern generated by the light guide surface.

Referring to FIGS. 5 to 7, it can be seen that, in the light emitting display apparatus according to another embodiment of the present disclosure, external light reflected after being incident upon the light extraction portion has a maximum intensity at a 0-th diffraction order due to a reflection diffraction grating effect by the convex portions of the light extraction portion. In addition, it can be seen that reflected light incident upon the light guide surface from the light extraction portion has a maximum intensity at a first diffraction order rather than a 0-th diffraction order through a blazed grating effect by the inclined light guide surface. As a result, the intensity generated by the light extraction portion 131 for each diffraction order may be offset as the intensity overlaps with the intensity generated by the light guide surface LGS for each diffraction order and, as such, the intensity of the diffraction pattern of the reflected light for each diffraction order emitting to the outside through the light emitting surface may be reduced.

Thus, the light emitting display apparatus according to another embodiment of the present disclosure may suppress or minimize generation of a rainbow pattern in a radial form due to the light extraction portion 131 according to inclusion of the light guide surface LGS inclinedly disposed between the light emitting surface 100*b* of the substrate 100 and the light reflection surface LRS of the light emitting device layer 150 and, as such, may reduce degradation in black visibility characteristics occurring due to reflection of external light by the light extraction portion 131. Accordingly, the light emitting display apparatus including the light guide surface LGS according to the embodiment of the present disclosure may realize real black in a non-driving or turning-off state thereof.

Figure 8:
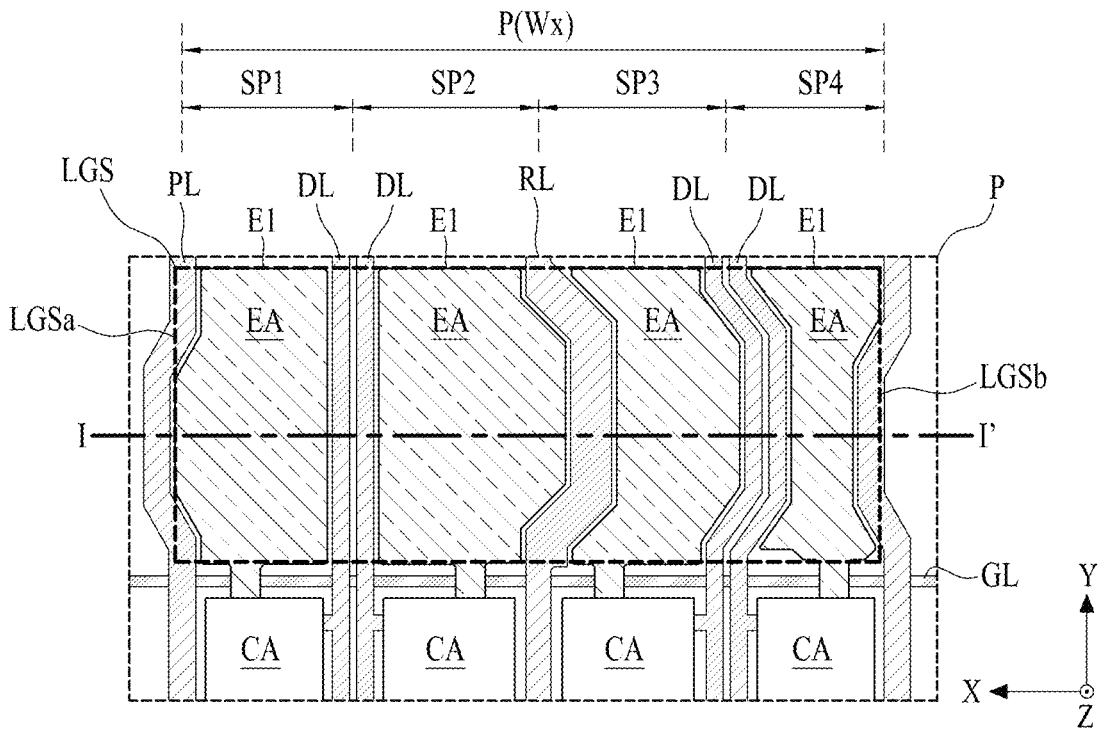
FIG. 8 is a plan view schematically illustrating one pixel in a light emitting display apparatus according to another embodiment of the present disclosure.
Figure 9:
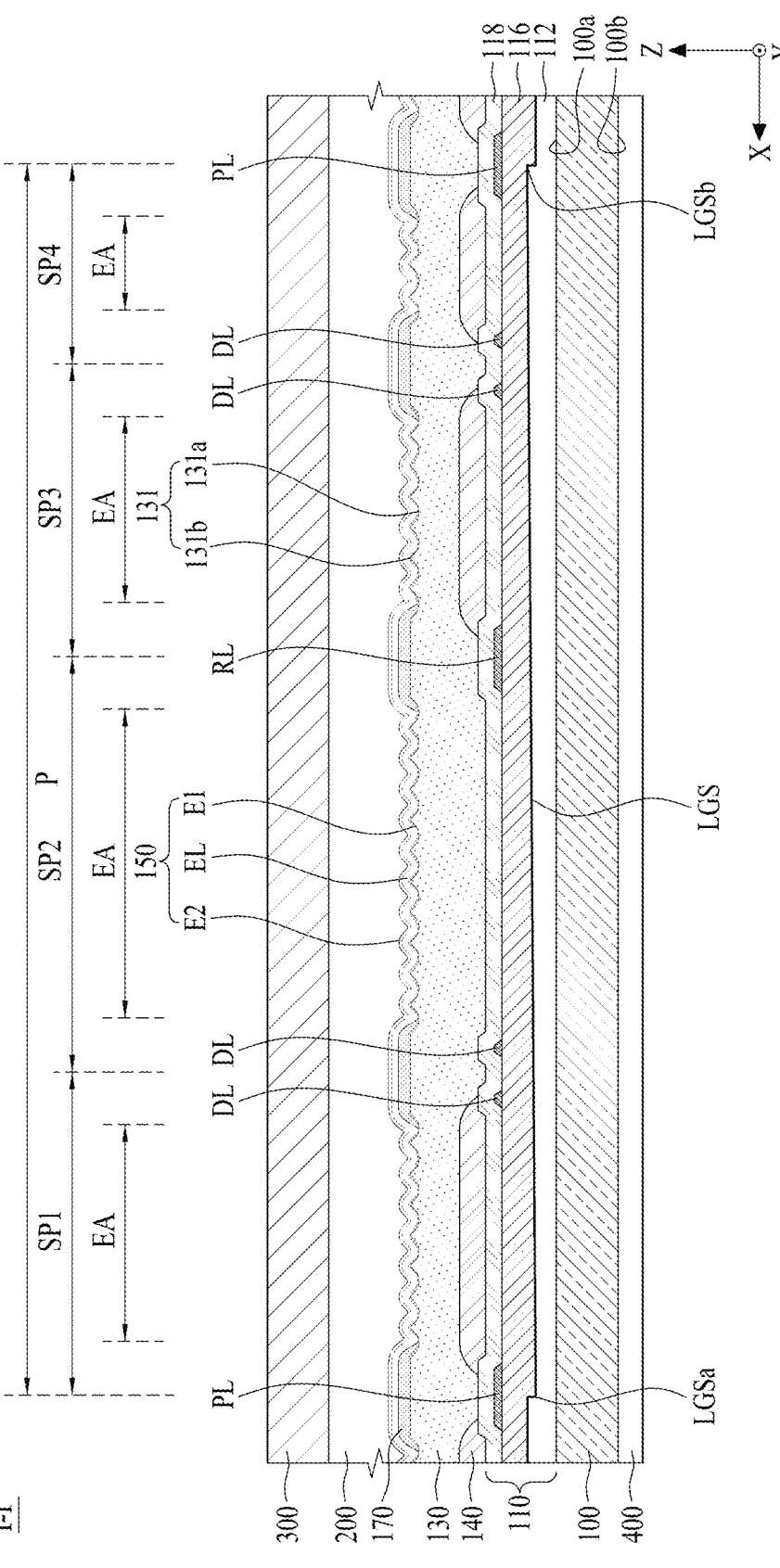
FIG. 9 is a cross-sectional view taken along line I-I' shown in FIG. 8 according to an embodiment of the present disclosure.
Figure 10:
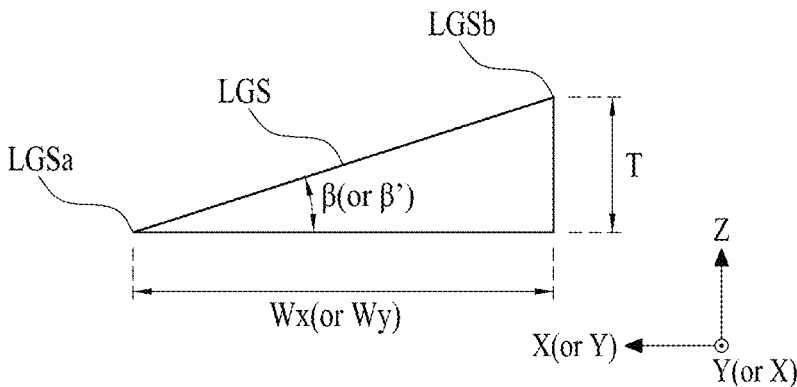
FIG. 10 is a view explaining an inclination of a light guide surface according to the embodiment of the present disclosure shown in FIG. 9.
Figure 11:
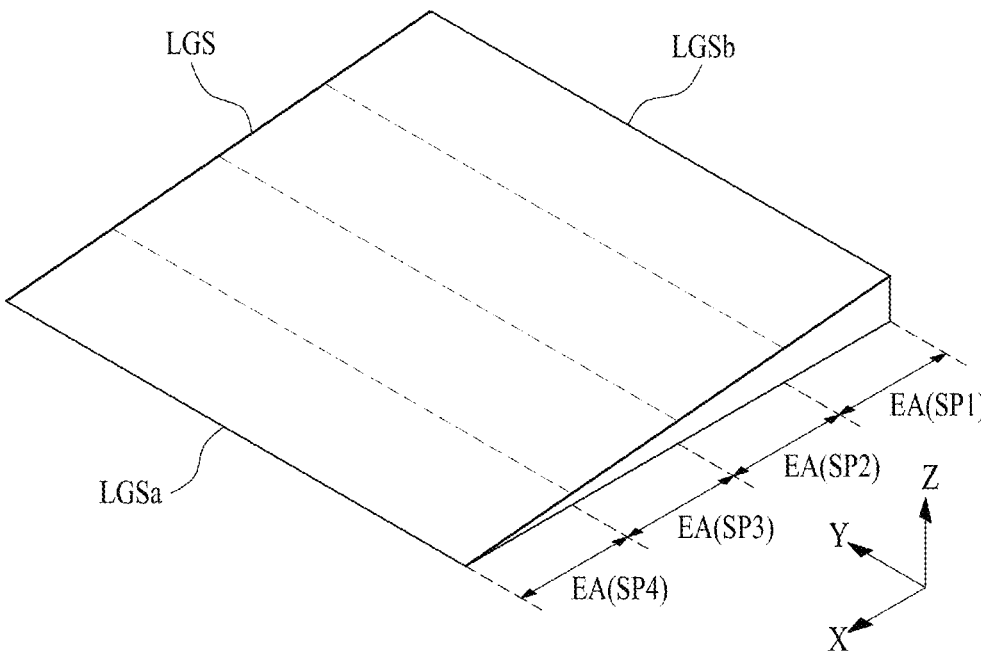
FIG. 11 is a perspective view explaining the light guide surface shown in FIG. 9 according to an embodiment of the present disclosure.

FIG. 8 is a plan view schematically illustrating one pixel in a light emitting display apparatus according to another embodiment of the present disclosure, FIG. 9 is a cross-sectional view taken along line I-I' shown in FIG. 8 according to one embodiment of the present disclosure, FIG. 10 is a view explaining an inclination of a light guide surface according to the embodiment of the present disclosure shown in FIG. 9, and FIG. 11 is a perspective view explaining the light guide surface shown in FIG. 9 according to one embodiment of the present disclosure. FIGS. 8 to 11 are views explaining a light guide surface according to a first embodiment of the present disclosure shown in FIG. 5. In the following description, therefore, the other elements except a light guide surface and relevant elements are referred to by like reference numerals, and their repetitive descriptions will be omitted.

Referring to FIGS. 8 and 9, in a light emitting display apparatus according to another embodiment of the present disclosure, a plurality of pixels P may each include four subpixels SP1 to SP4. For example, each of the plurality of pixels P may include first to fourth subpixel SP1 to SP4. For example, each of the plurality of pixels P may include a first subpixel SP1 of red, a second subpixel SP2 of white, a third subpixel SP3 of blue, and a fourth subpixel SP4 of green.

Each of the first to fourth subpixels SP1 to SP4 may include an emission area EA and a circuit area CA. The emission area EA may be disposed at one side (or an upper side) of a subpixel area, and the circuit area CA may be disposed at the other side (or a lower side) of the subpixel area. For example, the circuit area CA may be disposed under the emission area EA with reference to a second direction Y. The emission areas EA of each of the first to fourth subpixels SP1 to SP4 may have different sizes (or areas) from each other.

The first to fourth subpixels SP1 to SP4 may be disposed adjacent to one another along a first direction X. For example, two data lines DL extending in parallel to each other along the second direction Y may be disposed between the first subpixel SP1 and the second subpixel SP2 and between the third subpixel SP3 and the fourth subpixel SP4, respectively. A gate line GL extending along the first direction X may be disposed between the emission area EA and the circuit area CA in each of the first to fourth subpixels SP1 to SP4. A pixel power line PL extending along the second direction Y may be disposed at one side of the first subpixel SP1 or the fourth subpixel SP4. A reference line RL extending along the second direction Y may be disposed between the second subpixel SP2 and the third subpixel SP3. The reference line RL may be used as a sensing line for externally sensing a variation in characteristics of a driving thin film transistor disposed in the circuit area CA of the pixel P and/or a variation in characteristics of a light emitting device layer disposed at the circuit area CA in a sensing driving mode of the pixel P.

Referring to FIGS. 8 to 11, the light guide surface according to the first embodiment of the present disclosure, which is designated by reference character "LGS", may be formed or implemented at a buffer layer (or a first insulating layer) 112 of each of the plurality of pixels P. The light guide surface LGS may be formed at a buffer layer 112 overlapping with or corresponding to the emission area EA of each of the plurality of pixels P.

The light guide surface LGS may be disposed to overlap, in common, with respective emission areas EA of the plurality of subpixels SP1 to SP4 within one pixel P. The light guide surface LGS may include a first end portion LGSa disposed under (or below) the first subpixel SP1, and a second end portion LGSb disposed under (or below) the fourth subpixel SP4. The first end portion LGSa and the second end portion LGSb of the light guide surface LGS may be parallel to the second direction Y. For example, with respect to the first direction X, the first end portion LGSa of the light guide surface LGS may be disposed at one side (or a first side) of the pixel P, and the second end portion LGSb of the light guide surface LGS may be disposed at the other side (or a second side) of the pixel P opposite to the one side of the pixel P. In this regard, the light guide surface LGS may be referred to as, for example, a "horizontal inclined surface" or a "widthwise inclined surface".

According to an embodiment, the first end portion LGSa of the light guide surface LGS may be disposed nearer (or closer) to the light emitting surface 100b of the substrate 100 than the second end portion LGSb. Accordingly, the distance between the light emitting surface 100b of the substrate 100 and the light guide surface LGS may be gradually increased as the light guide surface LGS extends from the first end portion LGSa to the second end portion LGSb.

According to another embodiment, the second end portion LGSb of the light guide surface LGS may be disposed nearer (or closer) to the light emitting surface 100b of the substrate 100 than the first end portion LGSa. Accordingly, the distance between the light emitting surface 100b of the substrate 100 and the light guide surface LGS may be gradually increased as the light guide surface LGS extends from the second end portion LGSb to the first end portion LGSa.

An inclination $\beta$ of the light guide surface LGS or an angle $\beta$ between the light emitting surface 100b of the substrate 100 and the light guide surface LGS may be set according to a first width Wx (or a widthwise width or a horizontal width) of the pixel P parallel to the first direction X and a thickness T of the buffer layer 112. According to an embodiment, the inclination $\beta$ of the light guide surface LGS may be set within a range in which a value obtained by multiplying the first width Wx of the pixel P by a tangent $\beta$ ($\tan(\beta)$) is equal or less than a total thickness T of the buffer layer 112, as expressed by the following Expression 3.

$$Wx \times \tan(\beta) \leq T \qquad \text{[Expression 3]}$$

The inclination $\beta$ of the light guide surface LGS or the angle $\beta$ between the light emitting surface 100b of the substrate 100 and the light guide surface LGS according to an embodiment of the present disclosure may be 0.03 to 2.9°, more preferably, 0.03 to 0.72°.

As described above with reference to FIG. 6, the light guide surface LGS according to the first embodiment of the present disclosure may change, to a vertical direction, a diffraction path of light incident from the light extraction portion 131 through a blazed grating effect according to a blaze angle $\beta$, and may generate a diffraction pattern having a maximum intensity at a particular diffraction order other than a 0-th diffraction order, and, as such, may offset or minimize a diffraction pattern (or a diffraction pattern distribution) generated by the light extraction portion 131. As a result, it may be possible to suppress or minimize generation of a rainbow pattern in a radial form due to the light extraction portion 131. For example, the light guide surface LGS may change, to a vertical direction (or the second direction Y), a diffraction pattern spreading in a radial shape by the light extraction portion 131, thereby converting the diffraction pattern spreading in a radial shape into a diffraction pattern spreading in a vertical line shape. As a result, it may be possible to suppress generation of the rainbow pattern in the radial form.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the buffer layer 112 overlapping with each emission area EA of the plurality of pixels P. Accordingly, it may be possible to reduce degradation in black visibility characteristics occurring due to reflection of external light in a non-driving or turning-off state and, as such, real black may be realized.

Alternatively, in FIGS. 8 and 9, it has been described that the light guide surface LGS is disposed or implemented at the buffer layer 112 overlapping with the emission area EA of each of the plurality of pixels P, but the embodiments of the present disclosure are not limited thereto. For example, when a gate insulating layer (or a second insulating layer) 114 is formed at the entire surface of the buffer layer 112 to cover (or overlay) an active layer 113, the light guide surface LGS may be disposed or implemented at the gate insulating layer 114, which overlaps with the emission area EA of each of the plurality of pixels P. In this case, the same effect as described above may also be achieved.

Figure 12:
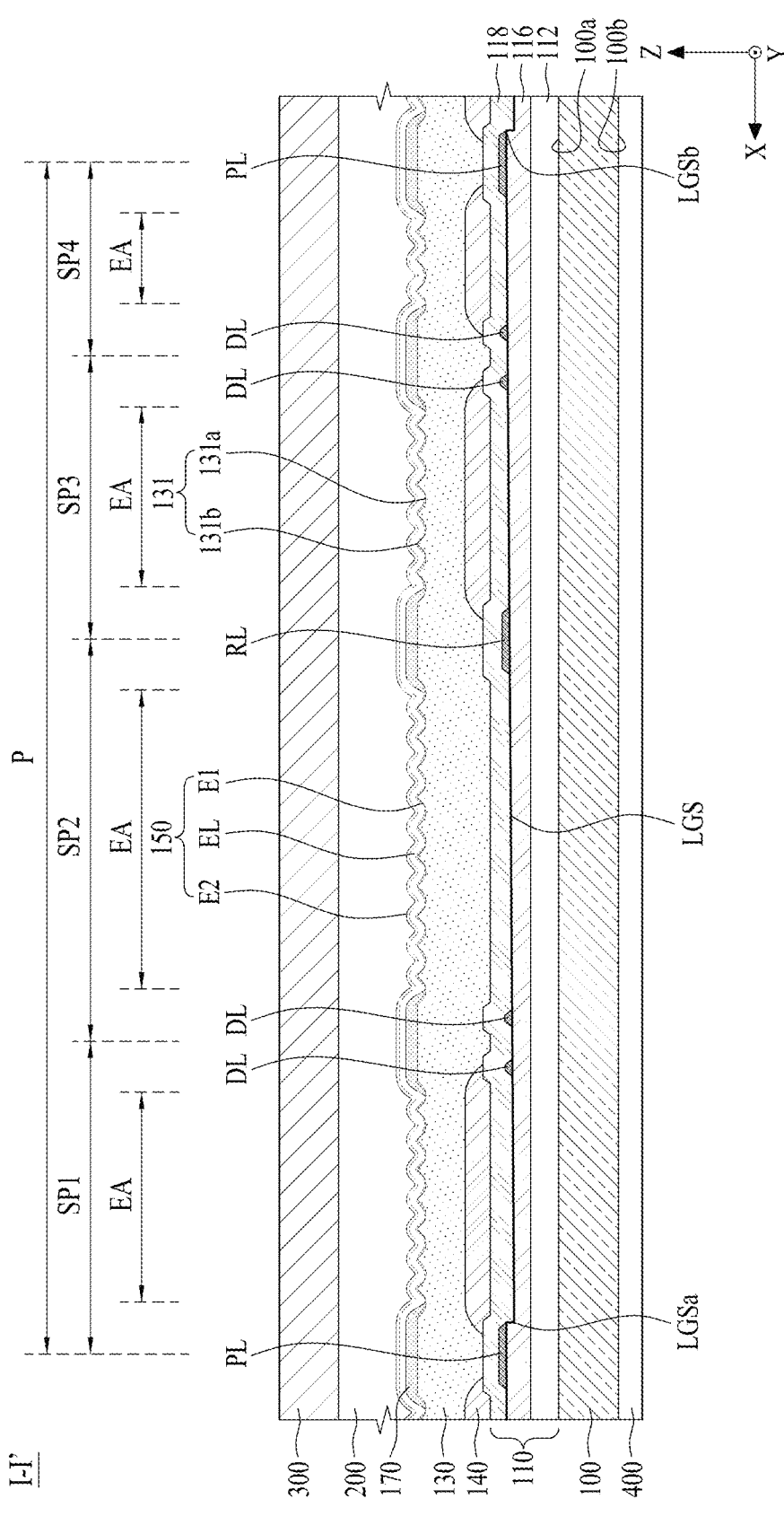
FIG. 12 is another cross-sectional view taken along line I-I' shown in FIG. 8 according to an embodiment of the present disclosure.

FIG. 12 is another cross-sectional view taken along line I-I' shown in FIG. 8 according to one embodiment. FIG. 12 is a view explaining a light guide surface according to a second embodiment of the present disclosure shown in FIG. 5. FIG. 12 illustrates an embodiment where the light guide surface is configured at an interlayer insulating layer 116 of the light emitting display apparatus described above with reference to FIG. 9. In the following description, therefore, the other elements except a light guide surface and relevant elements are referred to by like reference numerals, and their repetitive descriptions will be omitted.

Referring to FIG. 12, the light guide surface LGS according to the second embodiment of the present disclosure may be formed or implemented at an interlayer insulating layer (or a third insulating layer) 116 of each of a plurality of pixels P. The light guide surface LGS may be formed at the interlayer insulating layer 116 overlapping with or corresponding to the emission area EA of each of the plurality of pixels P. This light guide surface LGS is substantially identical to the light guide surface LGS shown in FIG. 9, except that the light guide surface LGS is formed at the interlayer insulating layer 116, and, as such, the repetitive description thereof will be omitted.

Referring to FIGS. 10 and 12, an inclination β of the light guide surface LGS or an angle β between the light emitting surface 100b of the substrate 100 and the light guide surface LGS may be set according to a first width Wx (or a widthwise width or a horizontal width) of the pixel P parallel to the first direction X and a thickness T of the interlayer insulating layer 116. According to an embodiment, as expressed by Expression 3, the inclination β of the light guide surface LGS may be set within a range in which a value obtained by multiplying the first width Wx of the pixel P by a tangent β (tan(β)) is equal or less than a total thickness T of the interlayer insulating layer 116.

As described above, the light guide surface LGS according to the second embodiment of the present disclosure may change, to a vertical direction, a diffraction path of light incident from the light extraction portion 131 through a blazed grating effect according to a blaze angle β, and may generate a diffraction pattern having a maximum intensity at a particular diffraction order other than a 0-th diffraction order, as described above with reference to FIG. 6, and, as such, may offset or minimize a diffraction pattern (or a diffraction pattern distribution) generated by the light extraction portion 131. As a result, it may be possible to suppress or minimize generation of the rainbow pattern in the radial form due to the light extraction portion 131.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the interlayer insulating layer 116 overlapping with each emission area EA of the plurality of pixels P. Accordingly, it may be possible to reduce degradation in black visibility characteristics occurring due to reflection of external light in a non-driving or turning-off state and, as such, real black may be realized.

Figure 13:
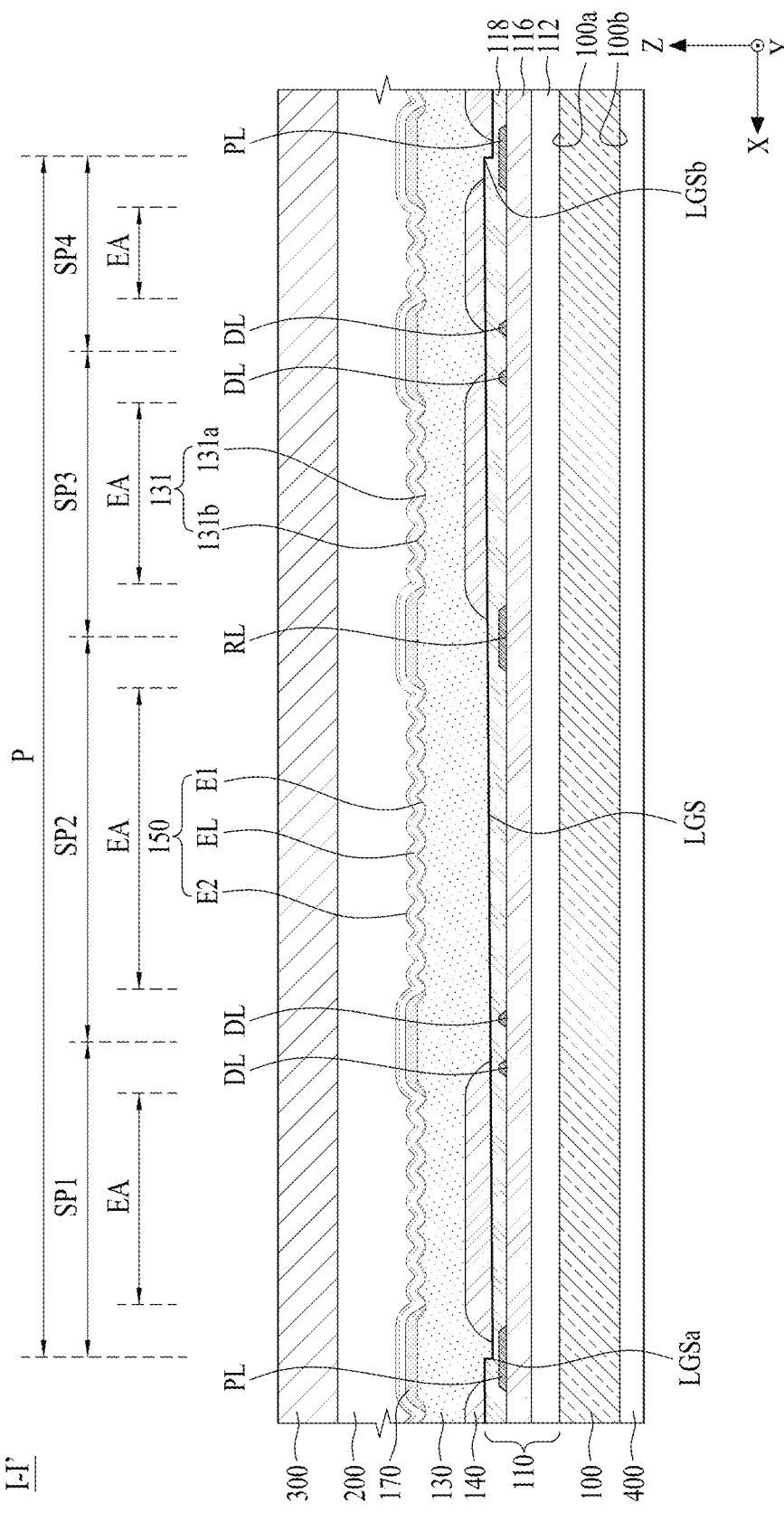
FIG. 13 is another cross-sectional view taken along line I-I' shown in FIG. 8 according to an embodiment of the present disclosure.

FIG. 13 is another cross-sectional view taken along line I-I' shown in FIG. 8 according to another embodiment. FIG. 13 is a view explaining a light guide surface according to a third embodiment of the present disclosure. FIG. 13 illustrates an embodiment where the light guide surface is configured at a passivation layer 118 of the light emitting display apparatus described above with reference to FIG. 9. In the following description, therefore, the other elements except a light guide surface and relevant elements are referred to by like reference numerals, and their repetitive descriptions are omitted.

Referring to FIG. 13, the light guide surface according to the third embodiment of the present disclosure, which is designated by reference character "LGS", may be formed or implemented at a passivation layer (or a fourth insulating layer) 118 of each of a plurality of pixels P. The light guide surface LGS may be formed at the passivation layer 118 overlapping with or corresponding to the emission area EA of each of the plurality of pixels P. This light guide surface LGS is substantially identical to the light guide surface LGS shown in FIG. 9, except that the light guide surface LGS is formed at the passivation layer 118, and, as such, the repetitive description thereof will be omitted.

Referring to FIGS. 10 and 13, an inclination β of the light guide surface LGS or an angle β between the light emitting surface 100b of the substrate 100 and the light guide surface LGS may be set according to a first width Wx (or a widthwise width or a horizontal width) of the pixel P parallel to the first direction X and a thickness T of the passivation layer 118. According to an embodiment, as expressed by Expression 3, the inclination β of the light guide surface LGS may be set within a range in which a value obtained by multiplying the first width Wx of the pixel P by a tangent β (tan(β)) is equal or less than a total thickness T of the passivation layer 118.

As described above, the light guide surface LGS according to the third embodiment of the present disclosure may change, to a vertical direction, a diffraction path of light incident from the light extraction portion 131 through a blazed grating effect according to a blaze angle β, and may generate a diffraction pattern having a maximum intensity at a particular diffraction order other than a 0-th diffraction order, as described above with reference to FIG. 6, and, as such, may offset or minimize a diffraction pattern (or a diffraction pattern distribution) generated by the light extraction portion 131. As a result, it may be possible to suppress or minimize generation of the rainbow pattern in the radial form due to the light extraction portion 131.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the passivation layer 118 overlapping with each emission area EA of the plurality of pixels P. Accordingly, it may be possible to reduce degradation in black visibility characteristics occurring due to reflection of external light in a non-driving or turning-off state and, as such, real black may be realized.

Figure 14:
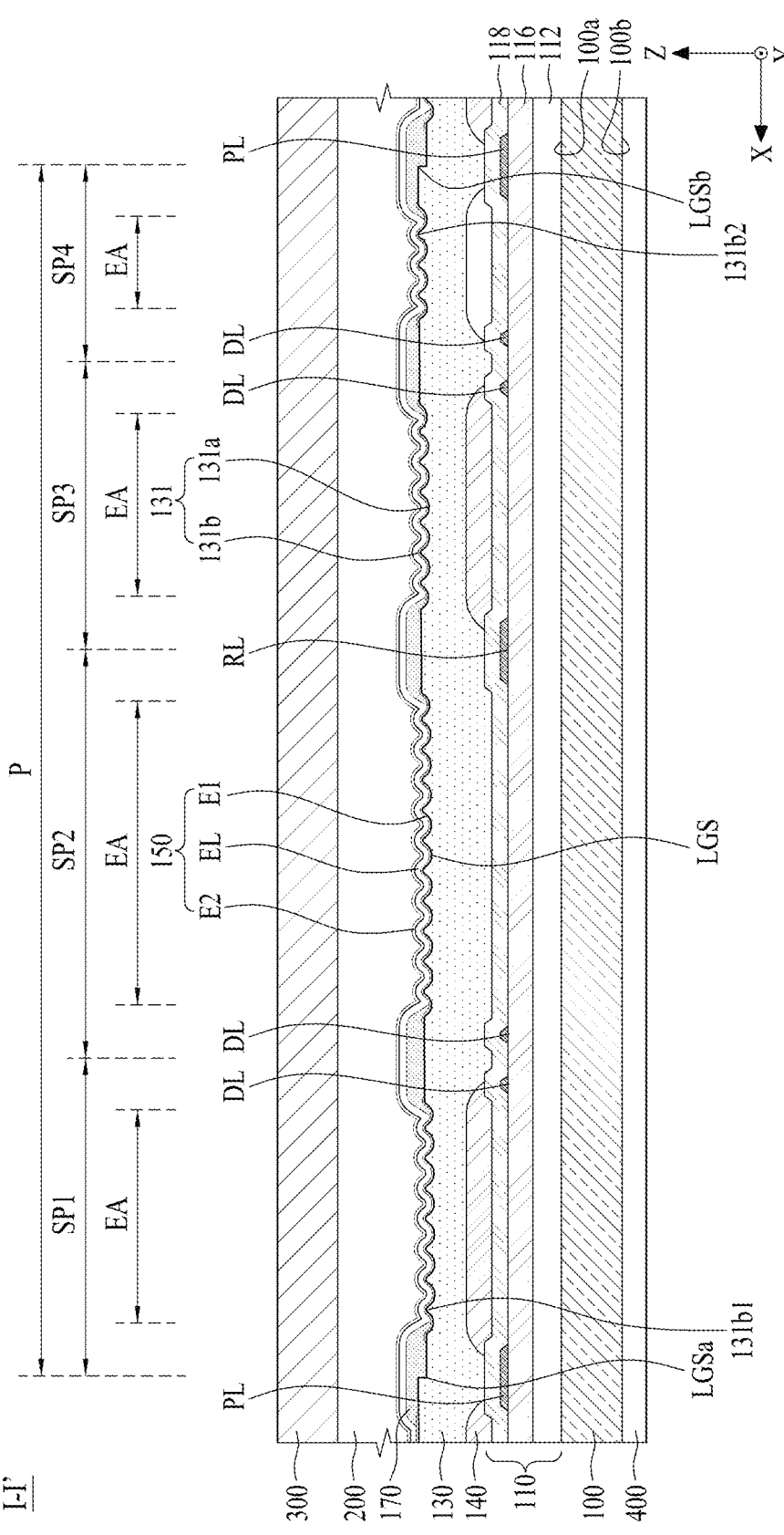
FIG. 14 is another cross-sectional view taken along line I-I' shown in FIG. 8 according to an embodiment of the present disclosure.
Figure 15:
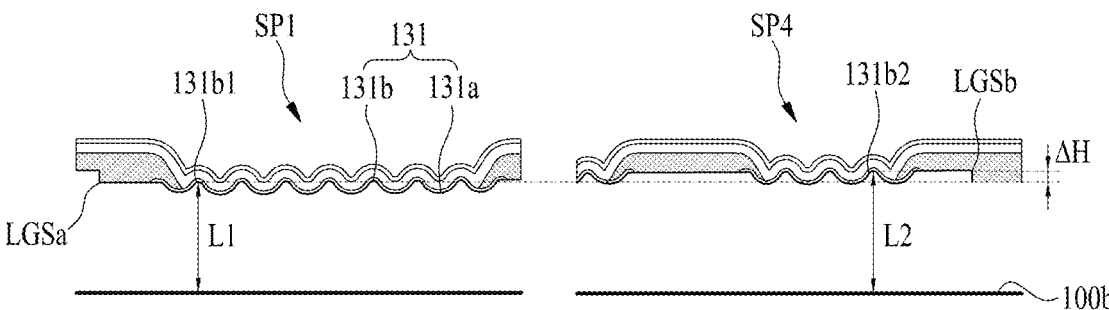
FIG. 15 is a view explaining a distance between a light emitting surface and each of a convex portion and a light guide surface shown in FIG. 14 according to an embodiment of the present disclosure.

FIG. 14 is another cross-sectional view taken along line I-I' shown in FIG. 8 according to one embodiment, and FIG. 15 is a view explaining a distance between a light emitting surface and each of a convex portion and a light guide surface shown in FIG. 14. FIGS. 14 and 15 are a view explaining a light guide surface according to a fourth embodiment of the present disclosure. FIGS. 14 and 15 illustrate an embodiment where the light guide surface is configured at a protection layer 130 of the light emitting display apparatus described above with reference to FIG. 9. In the following description, therefore, the other elements except a light guide surface and relevant elements are referred to by like reference numerals, and their repetitive descriptions will be omitted.

Referring to FIGS. 14 and 15, a light guide surface LGS according to a fourth embodiment of the present disclosure may be formed or implemented at a protection layer (or a fifth insulating layer) 130 of each of a plurality of pixels P. The light guide surface LGS may be formed at the protection layer 130 overlapping with or corresponding to the emission area EA of each of the plurality of pixels P.

The light guide surface LGS may be disposed to overlap, in common, with respective emission areas EA of the plurality of subpixels SP1 to SP4 within one pixel P. The light guide surface LGS may include a first end portion LGSa disposed under (or below) the first subpixel SP1, and a second end portion LGSb disposed under (or below) the fourth subpixel SP4. The first end portion LGSa and the second end portion LGSb of the light guide surface LGS may be parallel to the second direction Y. For example, with respect to the first direction X, the first end portion LGSa of the light guide surface LGS may be disposed at one side (or a first side) of the pixel P, and the second end portion LGSb of the light guide surface LGS may be disposed at the other side (or a second side) of the pixel P opposite to the one side of the pixel P. In this regard, the light guide surface LGS may be referred to as, for example, a "horizontal inclined surface" or a "widthwise inclined surface".

According to an embodiment, the first end portion LGSa of the light guide surface LGS may be disposed nearer (or closer) to the light emitting surface 100b of the substrate 100 than the second end portion LGSb. Accordingly, the distance between the light emitting surface 100b of the substrate 100 and the light guide surface LGS may be gradually increased as the light guide surface LGS extends from the first end portion LGSa to the second end portion LGSb.

According to another embodiment, the second end portion LGSb of the light guide surface LGS may be disposed nearer (or closer) to the light emitting surface 100b of the substrate 100 than the first end portion LGSa. Accordingly, the distance between the light emitting surface 100b of the substrate 100 and the light guide surface LGS may be gradually increased as the light guide surface LGS extends from the second end portion LGSb to the first end portion LGS a.

Referring to FIGS. 10 and 14, an inclination β of the light guide surface LGS or an angle β between the light emitting surface 100b of the substrate 100 and the light guide surface LGS may be set according to a first width Wx (or a widthwise width or a horizontal width) of the pixel P parallel to the first direction X and a thickness T of the protection layer 130. According to an embodiment, as expressed by Expression 3, the inclination β of the light guide surface LGS may be set within a range in which a value obtained by multiplying the first width Wx of the pixel P by a tangent β (tan(β)) is equal or less than a total thickness T of the protection layer 130.

A light extraction portion 131 disposed at the protection layer 130 of each of the plurality of pixels P may include a plurality of concave portions 131a formed to be concave from the light guide surface LGS, and convex portions 131b disposed among the plurality of concave portions 131a. Distances L1 and L2 between respective convex portions 131b disposed at different positions in the first direction X and the light emitting surface 100b of the substrate 100 may be different.

According to an embodiment, within each of the plurality of pixels P, a first outermost convex portion 131b1 disposed most adjacent to a first end portion LGSa of the light guide surface LGS may be disposed nearer (or closer) to the light emitting surface 100b of the substrate 100 than a second outermost convex portion 131b2 disposed most adjacent to a second end portion LGSb of the light guide surface LGS, with reference to the first direction X. Accordingly, a first distance L1 between the first outermost convex portion 131b1 and the light emitting surface 100b of the substrate 100 may be smaller than a second distance L2 between the second outermost convex portion 131b2 and the light emitting surface 100b of the substrate 100. For example, with reference to the light emitting surface 100b of the substrate 100, a height difference (or a step length) ΔH between the first outermost convex portion 131b1 and the second outermost convex portion 131b2 may be equal to a height difference (or a step length) between the first end portion LGSa and the second end portion LGSb of the light guide surface LGS. Accordingly, distances L1 and L2 between the light emitting surface 100b of the substrate 100 and respective convex portions 131b with reference to the first direction X may be gradually increased as the light guide surface LGS extends from the first end portion LGSa to the second end portion LGSb.

According to another embodiment, within each of the plurality of pixels P, the second outermost convex portion 131b2 may be disposed nearer (or closer) to the light emitting surface 100b of the substrate 100 than the first outermost convex portion 131b1, with reference to the first direction X. Accordingly, the second distance L2 between the second outermost convex portion 131b2 and the light emitting surface 100b of the substrate 100 may be smaller than the first distance L1 between the first outermost convex portion 131b1 and the light emitting surface 100b of the substrate 100. Accordingly, distances L1 and L2 between the light emitting surface 100b of the substrate 100 and respective convex portions 131b with reference to the first direction X may be gradually increased as the light guide surface LGS extends from the second end portion LGSb to the first end portion LGSa.

As described above, the light guide surface LGS according to the fourth embodiment of the present disclosure may change, to a vertical direction, a diffraction path of light incident from the light extraction portion 131 through a blazed grating effect according to a blaze angle β, and may generate a diffraction pattern having a maximum intensity at a particular diffraction order other than a 0-th diffraction order, as described above with reference to FIG. 6, and, as such, may offset or minimize a diffraction pattern (or a diffraction pattern distribution) generated by the light extraction portion 131. As a result, it may be possible to suppress or minimize generation of the rainbow pattern in the radial form due to the light extraction portion 131.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the protection layer 130 overlapping with each emission area EA of the plurality of pixels P. Accordingly, it may be possible to reduce degradation in black visibility characteristics occurring due to reflection of external light in a non-driving or turning-off state and, as such, real black may be realized.

Figure 16:
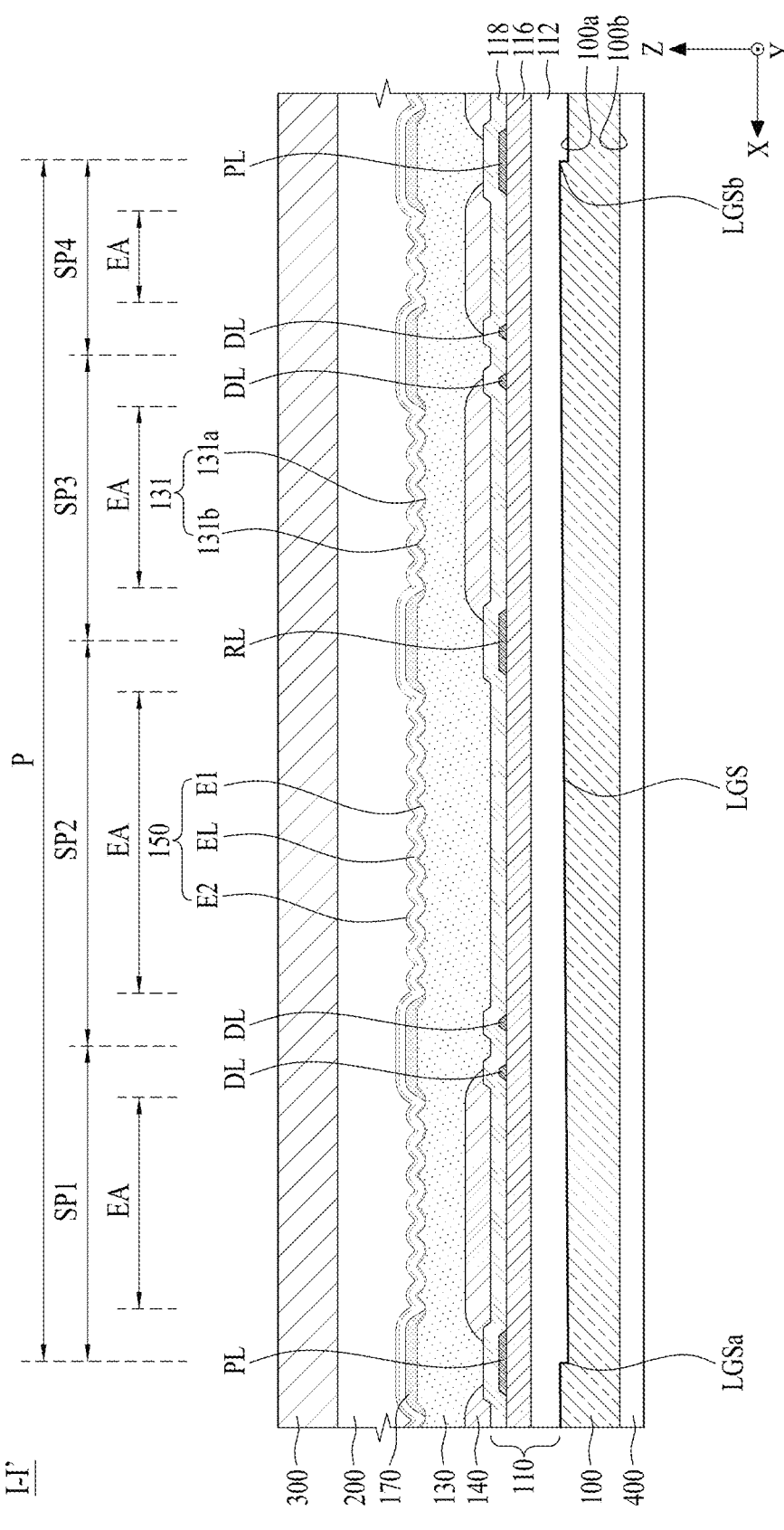
FIG. 16 is another cross-sectional view taken along line I-I' shown in FIG. 8 according to an embodiment of the present disclosure.

FIG. 16 is another cross-sectional view taken along line I-I' shown in FIG. 8 according to one embodiment. FIG. 16 is a view explaining a light guide surface according to a fifth embodiment of the present disclosure shown in FIG. 5. FIG. 16 illustrates an embodiment where the light guide surface is configured at a first surface 100a (or an inner surface) of the substrate of the light emitting display apparatus described above with reference to FIG. 9. In the following description, therefore, the other elements except a light guide surface and relevant elements are referred to by like reference numerals, and their repetitive descriptions will be omitted.

Referring to FIG. 16, the light guide surface LGS according to the fifth embodiment of the present disclosure may be formed or implemented at a first surface 100a of the substrate 100 overlapping with each of a plurality of pixels P. The light guide surface LGS may be formed at the first surface 100a of the substrate 100 overlapping with or corresponding to an emission area EA of each of the plurality of pixels P. The light guide surface LGS is formed to be concave from the first surface 100a of the substrate 100 and, as such, may be an inclined groove or a tilted groove. The light guide surface LGS as described above is substantially identical to the light guide surface LGS shown in FIG. 9, except that the light guide surface LGS is formed at the first surface 100a of the substrate 100, and, as such, the repetitive description thereof will be omitted.

Referring to FIGS. 10 and 16, an inclination β of the light guide surface LGS or an angle β between the light emitting surface 100b of the substrate 100 and the light guide surface LGS may be set according to a first width Wx (or a widthwise width or a horizontal width) of the pixel P parallel to the first direction X and a thickness T of the substrate 100. According to an embodiment, inclination β of the light guide surface LGS may be set within a range in which a value obtained by multiplying the first width Wx of the pixel P by a tangent ($\tan(β)$) is equal or less than a half thickness of the substrate 100.

As described above, the light guide surface LGS according to the fifth embodiment of the present disclosure may change, to a vertical direction, a diffraction path of light incident from the light extraction portion 131 through a blazed grating effect according to a blaze angle β, and may generate a diffraction pattern having a maximum intensity at a particular diffraction order other than a 0-th diffraction order, as described above with reference to FIG. 6, and, as such, may offset or minimize a diffraction pattern (or a diffraction pattern distribution) generated by the light extraction portion 131. As a result, it may be possible to suppress or minimize generation of the rainbow pattern in the radial form due to the light extraction portion 131.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the first surface 100a of the substrate overlapping with each emission area EA of the plurality of pixels P. Accordingly, it may be possible to reduce degradation in black visibility characteristics occurring due to reflection of external light in a non-driving or turning-off state and, as such, real black may be realized.

Figure 17:
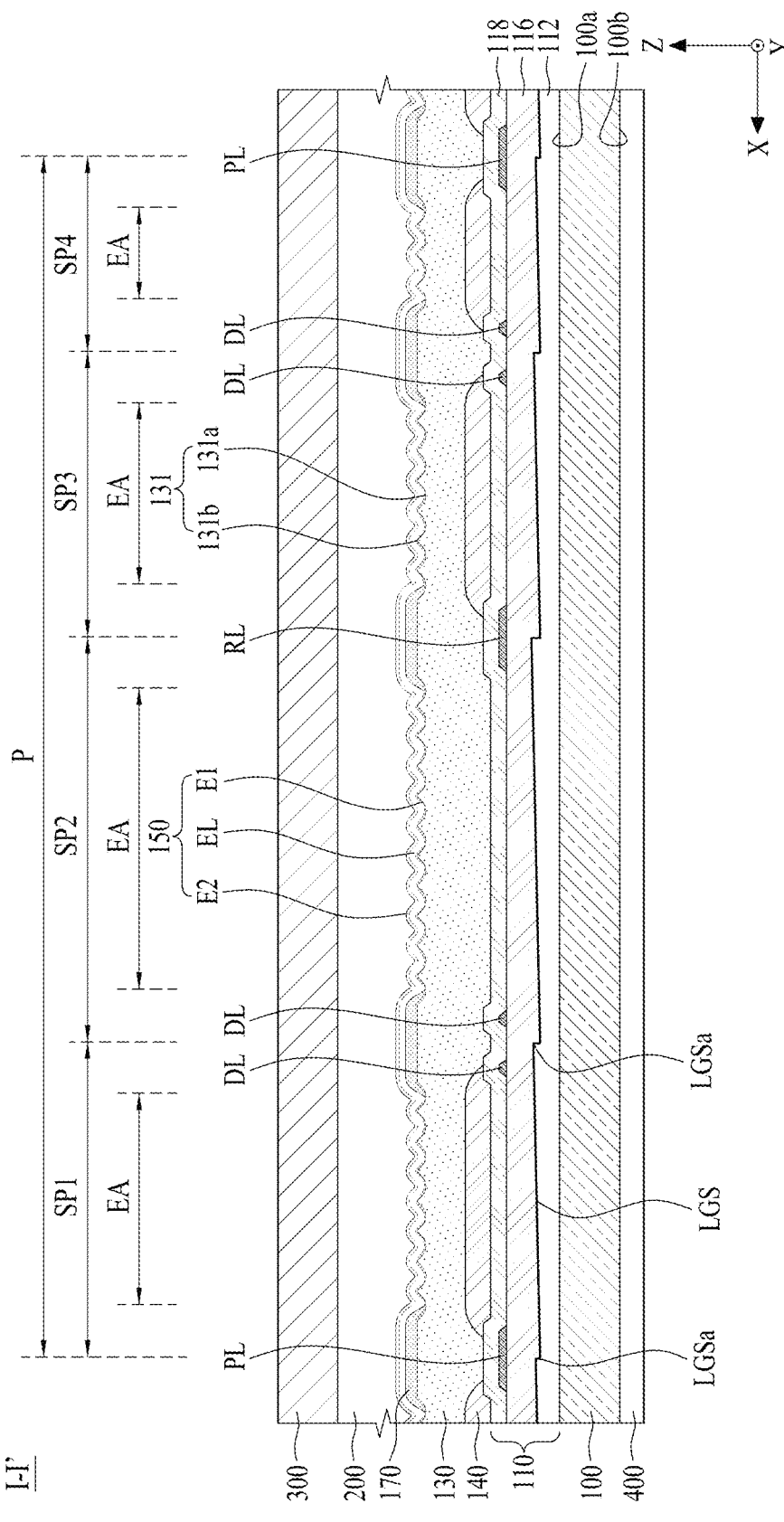
FIG. 17 is another cross-sectional view taken along line I-I' shown in FIG. 8 according to an embodiment of the present disclosure.
Figure 18:
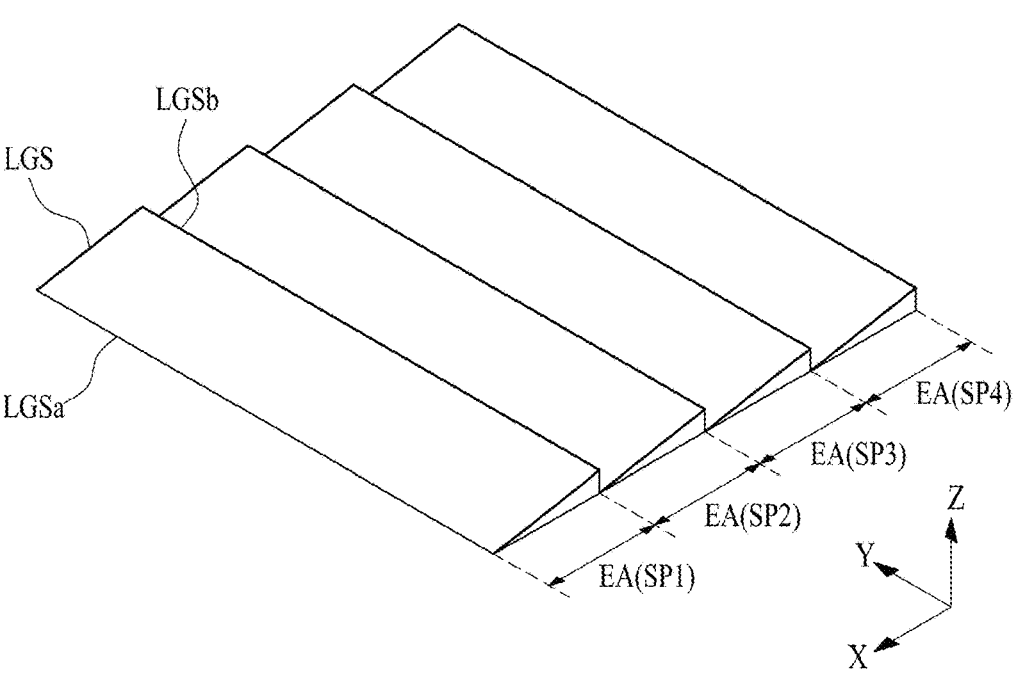
FIG. 18 is a perspective view schematically illustrating a light guide surface disposed at each of a plurality of sub-pixels shown in FIG. 17 according to an embodiment of the present disclosure.

FIG. 17 is another cross-sectional view taken along line I-I' shown in FIG. 8, and FIG. 18 is a perspective view schematically illustrating a light guide surface disposed at each of a plurality of subpixels SP shown in FIG. 17. FIGS. 17 and 18 are views explaining a light guide surface according to a sixth embodiment of the present disclosure. FIGS. 17 and 18 illustrate an embodiment where the light guide surface described above with reference to FIGS. 8 to 10 is individually configured at each of a plurality of subpixels. In the following description, therefore, the other elements except a light guide surface and relevant elements are referred to by like reference numerals, and their repetitive descriptions will be omitted.

Referring to FIGS. 17 and 18, the light guide surface LGS according to the sixth embodiment of the present disclosure may be formed or implemented at a buffer layer (or a first insulating layer) 112 of each of a plurality of subpixels SP. The light guide surface LGS may be formed at the buffer layer 112 overlapping with or corresponding to the emission area EA of each of the plurality of pixels P.

The light guide surface LGS may be individually disposed to overlap with an emission area EA of each of a plurality of subpixels SP1 to SP4 within one pixel P. The light guide surface LGS may have a size corresponding to the size of the emission area EA of each of the plurality of subpixels SP1 to SP4. The light guide surface LGS may have a size corresponding to the size of a light extraction portion 131 disposed at each of the plurality of subpixels SP1 to SP4. The light guide surface LGS may have a size corresponding to a color filter layer 140 disposed at each of the plurality of subpixels SP1 to SP4.

The light guide surface LGS individually disposed at each of the plurality of subpixels SP may include a first end portion LGSa disposed at one side (or a first side) of the emission area EA, and a second end portion LGSb disposed at the other side (or a second side) of the emission area EA opposite to the one side of the emission area EA. The first end portion LGSa and the second end portion LGSb of the light guide surface LGS may be parallel to the second direction Y. The light guide surface LGS as described above is substantially identical to the light guide surface LGS described above with reference to FIGS. 8 to 10, except that the light guide surface LGS is individually disposed at each of the plurality of subpixels SP, and the repetitive description thereof will be omitted.

Referring to FIGS. 10 and 17, all inclinations 13 of respective light guide surfaces LGS individually disposed at the plurality of subpixels SP or all angles 13 between the light emitting surface 100*b* of the substrate 100 and respective light guide surfaces LGS may be equal. For example, the inclinations β of the light guide surface LGS or the angle β between the light emitting surface 100*b* of the substrate 100 and the light guide surface LGS may be set according to an average subpixel width Wsub, parallel to the first direction X, of the subpixels SP1 to SP4 in one pixel P and a thickness T of the buffer layer 112. According to an embodiment, the inclination β of the light guide surface LGS may be set within a range in which a value obtained by multiplying the average subpixel width Wsub of the pixel P by a tangent β (tan(β)) is equal or less than a total thickness T of the buffer layer 112, as expressed by the following Expression 4.

$$W\text{sub}\times\tan(\beta)\le T \qquad \text{[Expression 4]}$$

According to an embodiment of the present disclosure, the inclination β of the light guide surface LGS or the angle β between the light emitting surface 100*b* of the substrate 100 and the light guide surface LGS may be 0.03 to 2.9°, more preferably, 0.03 to 0.72°.

As described above, the light guide surface LGS according to the sixth embodiment of the present disclosure may change, to a vertical direction, a diffraction path of light incident from the light extraction portion 131 through a blazed grating effect according to a blaze angle β, and may generate a diffraction pattern having a maximum intensity at a particular diffraction order other than a 0-th diffraction order, as described above with reference to FIG. 6, and, as such, may offset or minimize a diffraction pattern (or a diffraction pattern distribution) generated by the light extraction portion 131. As a result, it may be possible to suppress or minimize generation of the rainbow pattern in the radial form due to the light extraction portion 131.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the buffer layer 112 overlapping with each emission area EA of the plurality of pixels P. Accordingly, it may be possible to reduce degradation in black visibility characteristics occurring due to reflection of external light in a non-driving or turning-off state and, as such, real black may be realized.

Alternatively, the light guide surface LGS individually disposed at each of the plurality of subpixels SP, which is described above with reference to FIGS. 17 and 18, may be applied to the gate insulating layer (or the second insulating layer) 114, the interlayer insulating layer 116, the passivation layer 118, the protection layer 130, or the first surface 100*a* of the substrate 100 such that the light guide surface LGS overlaps with the emission area EA of each of the plurality of subpixels SP, as in the cases shown in FIGS. 11 to 16. The same effect may also be achieved in this case.

Figure 19:
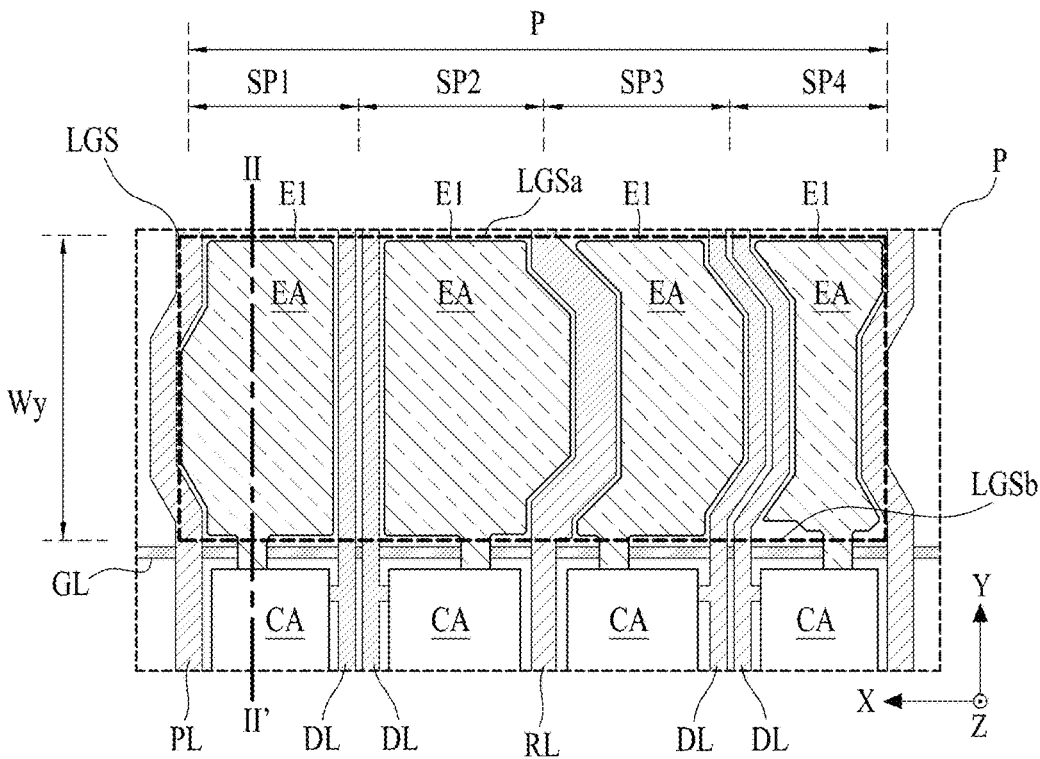
FIG. 19 is a plan view schematically illustrating one pixel in a light emitting display apparatus according to another embodiment of the present disclosure.
Figure 20:
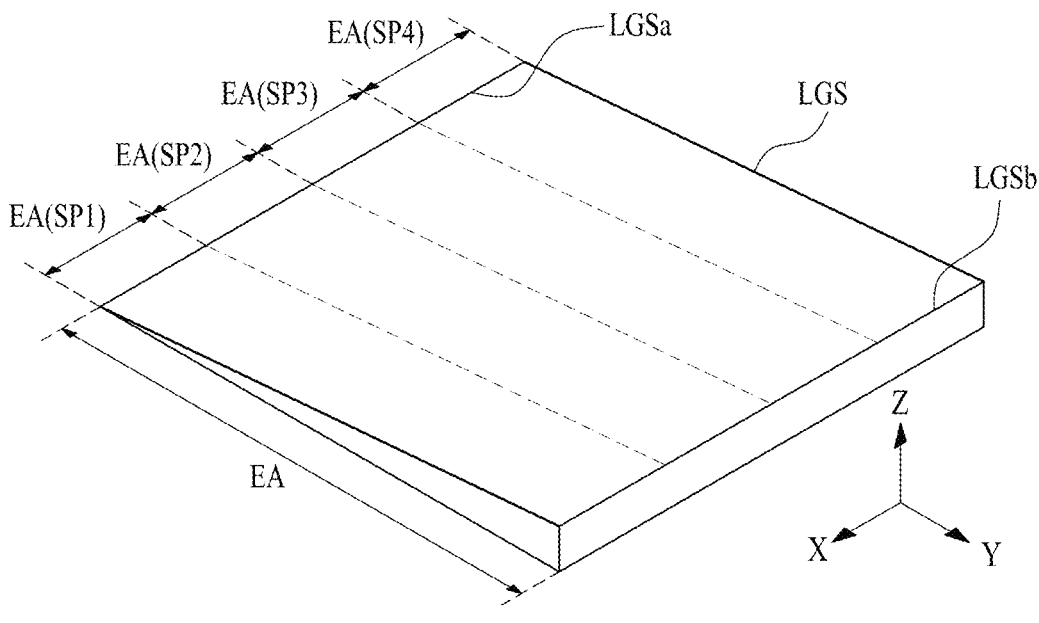
FIG. 20 is a perspective view explaining a light guide surface shown in FIG. 19 according to an embodiment of the present disclosure.
Figure 21:
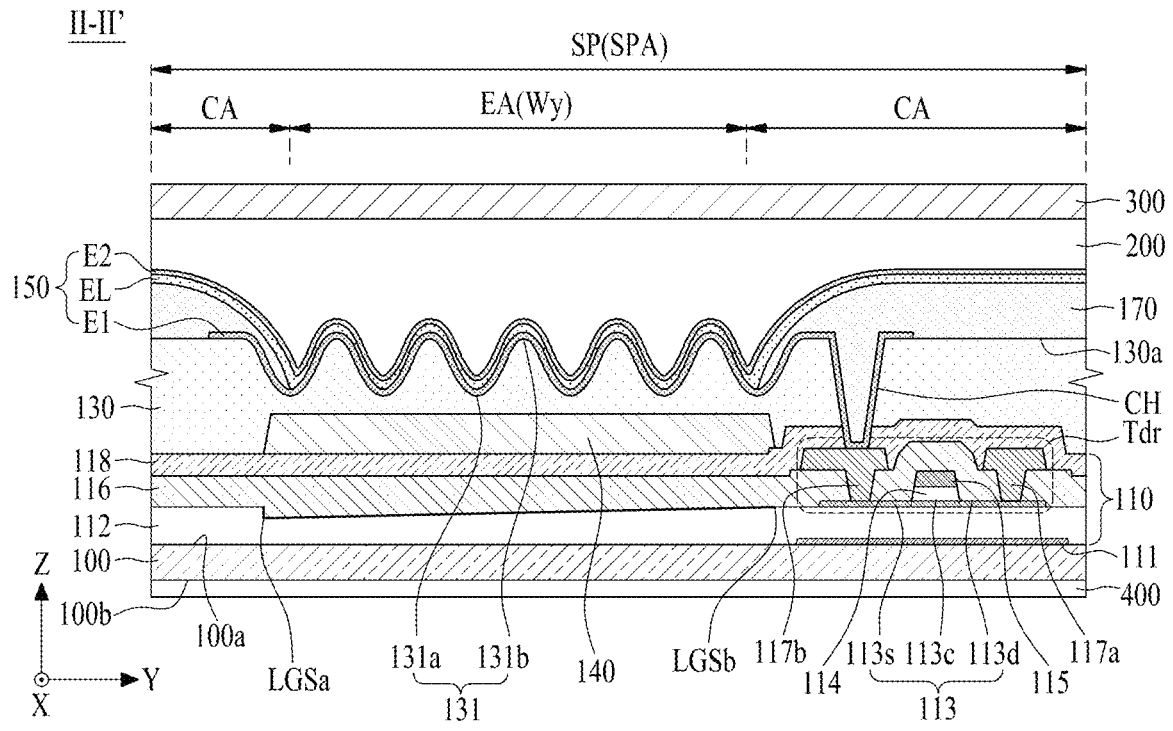
FIG. 21 is a cross-sectional view taken along line II-II' shown in FIG. 19 according to an embodiment of the present disclosure.

FIG. 19 is a plan view schematically illustrating one pixel in a light emitting display apparatus according to another embodiment of the present disclosure, FIG. 20 is a perspective view explaining a light guide surface shown in FIG. 19 according to one embodiment, and FIG. 21 is a cross-sectional view taken along line II-IP shown in FIG. 19 according to one embodiment. FIGS. 19 to 21 are views explaining a light guide surface according to a seventh embodiment of the present disclosure. FIGS. 19 to 21 illustrate an embodiment where the direction of the light guide surface of the light emitting display apparatus described above with reference to FIGS. 8 to 16 is changed. In the following description, therefore, the other elements except a light guide surface and relevant elements are referred to by like reference numerals, and their repetitive descriptions will be omitted.

Referring to FIGS. 19 to 21, the light guide surface according to the seventh embodiment of the present disclosure, which is designated by reference character "LGS", may be formed or implemented at a buffer layer (or a first insulating layer) 112 of each of a plurality of subpixels SP. The light guide surface LGS may be formed at the buffer layer 112 overlapping with or corresponding to the emission area EA of each of the plurality of subpixels SP.

The light guide surface LGS may be disposed to overlap, in common, with respective emission areas EA of the plurality of subpixels SP1 to SP4 within one pixel P. The light guide surface LGS may include a first end portion LGSa disposed, in common, under (or below) respective upper sides of a plurality of subpixels SP1 to SP4, and a second end portion LGSb disposed, in common, under (or below) respective lower sides of the plurality of subpixels SP1 to SP4. The first end portion LGSa and the second end portion LGSb of the light guide surface LGS may be parallel to a first direction X. For example, with reference to a second direction Y, the first end portion LGSa of the light guide surface LGS may be disposed, in common, at upper sides (or third sides) of respective emission areas EA of the plurality of subpixels SP1 to SP4 in one pixel P, and the second end portion LGSb of the light guide surface LGS may be disposed, in common, at lower sides (or fourth sides), opposite to the upper sides, of respective emission areas EA of the plurality of subpixels SP1 to SP4 in the pixel P. In this regard, the light guide surface LGS may be referred to as, for example, a "vertical inclined surface" or a "lengthwise inclined surface".

According to an embodiment, the second end portion LGSb of the light guide surface LGS may be disposed nearer (or closer) to the light emitting surface 100*b* of the substrate 100 than the first end portion LGSa. Accordingly, the distance between the light emitting surface 100*b* of the substrate 100 and the light guide surface LGS may be gradually increased as the light guide surface LGS extends from the second end portion LGSb to the first end portion LGS a.

According to another embodiment, the first end portion LGSa of the light guide surface LGS may be disposed nearer (or closer) to the light emitting surface 100*b* of the substrate 100 than the second end portion LGSb. Accordingly, the distance between the light emitting surface 100*b* of the substrate 100 and the light guide surface LGS may be gradually increased as the light guide surface LGS extends from the first end portion LGSa to the second end portion LGSb.

Referring to FIGS. 10, 20 and 21, an inclination 13' of the light guide surface LGS or an angle β' between a light emitting surface 100*b* of a substrate 100 and the light guide surface LGS may be set according to a width Wy of the pixel P (or a lengthwise width or a vertical width) parallel to the second direction Y and a thickness T of the buffer layer 112. The inclination β' of the light guide surface LGS may be set within a range in which a value obtained by multiplying the width Wy of the emission area EA parallel to the second direction Y in the pixel P by a tangent β' (tan(β')) is equal or less than a total thickness T of the buffer layer 112, as expressed by the following Expression 5.

$$W\text{y}\times\tan(\beta')\le T \qquad \text{[Expression 5]}$$

The inclination β' of the light guide surface LGS or the angle β' between the light emitting surface 100b of the substrate 100 and the light guide surface LGS according to the other embodiment of the present disclosure shown in FIGS. 20 and 21 may be 0.05 to 1.26°, more preferably, 0.05 to 0.13°.

As described above, the light guide surface LGS according to the seventh embodiment of the present disclosure may change, to a horizontal direction, a diffraction path of light incident from the light extraction portion 131 through a blazed grating effect according to a blaze angle β, and may generate a diffraction pattern having a maximum intensity at a particular diffraction order other than a 0-th diffraction order, as described above with reference to FIG. 6, and, as such, may offset or minimize a diffraction pattern (or a diffraction pattern distribution) generated by the light extraction portion 131. As a result, it may be possible to suppress or minimize generation of the rainbow pattern in the radial form due to the light extraction portion 131.

Therefore, the light emitting display apparatus according to the embodiment of the present disclosure may suppress or minimize generation of the rainbow pattern in the radial form due to the light extraction portion 131 according to a blazed grating effect of the light guide surface LGS as the light emitting display apparatus includes the light guide surface LGS inclinedly disposed at the buffer layer 112 overlapping with each emission area EA of the plurality of pixels P. Accordingly, it may be possible to reduce degradation in black visibility characteristics occurring due to reflection of external light in a non-driving or turning-off state and, as such, real black may be realized.

Alternatively, in FIG. 21, it has been described that the light guide surface LGS is disposed or implemented at the buffer layer 112, but the embodiments of the present disclosure are not limited thereto. For example, when a gate insulating layer (or a second insulating layer) 114 is formed at the entire surface of the buffer layer 112 to cover (or overlay) an active layer 113, the light guide surface LGS may be disposed or implemented at the gate insulating layer 114, which overlaps with the emission area EA of each of the plurality of pixels P. In this case, the same effect as described above may also be achieved.

Figure 22:
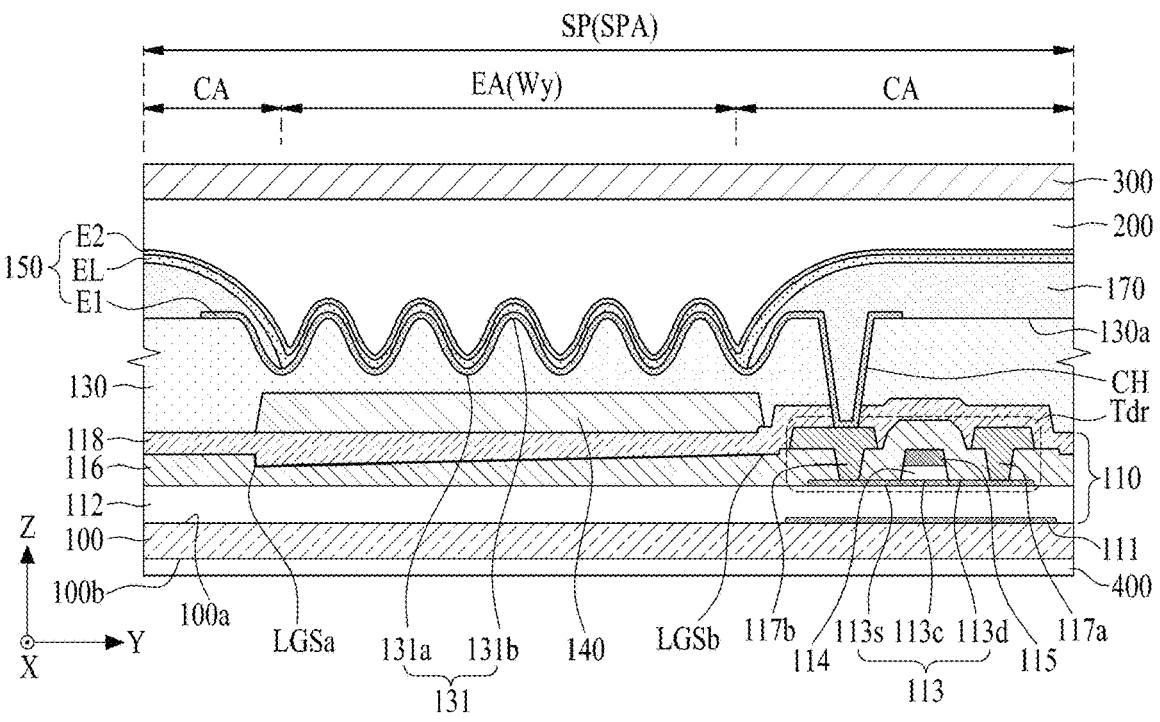
FIG. 22 is another cross-sectional view taken along line II-II' shown in FIG. 19 according to an embodiment of the present disclosure.
Figure 23:
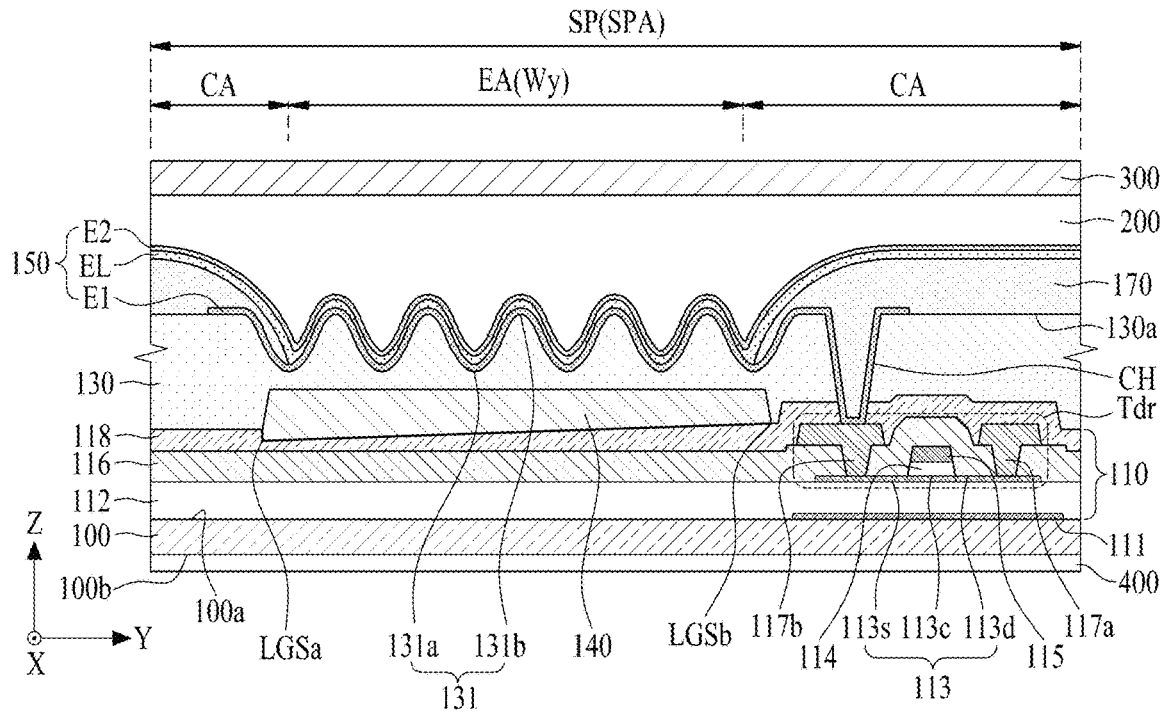
FIG. 23 is another cross-sectional view taken along line II-II' shown in FIG. 19 according to an embodiment of the present disclosure.

Alternatively, the light guide surface LGS according to the seventh embodiment of the present disclosure may be formed at an interlayer insulating layer 116, as shown in FIG. 22, or may be disposed or implemented at a passivation layer 118, as shown in FIG. 23. In this case, the same effect as described above may also be achieved. Alternatively, although not shown, the light guide surface LGS may be disposed or implemented at a protection layer 130 or a first surface 100a of the substrate 100, similarly to the case shown in FIGS. 14 to 16. In this case, the same effect as described above may also be achieved.

Figure 24A:
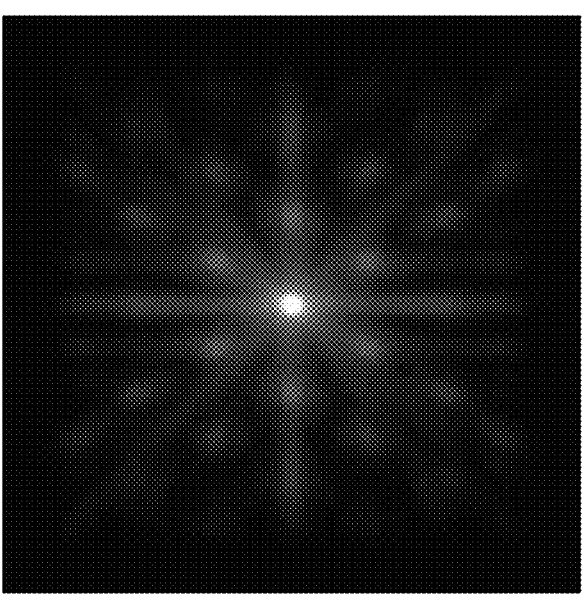
FIG. 24A is a photograph illustrating black visibility characteristics of the light emitting display apparatus according to the embodiment of the present disclosure shown in FIG. 2.
Figure 24B:
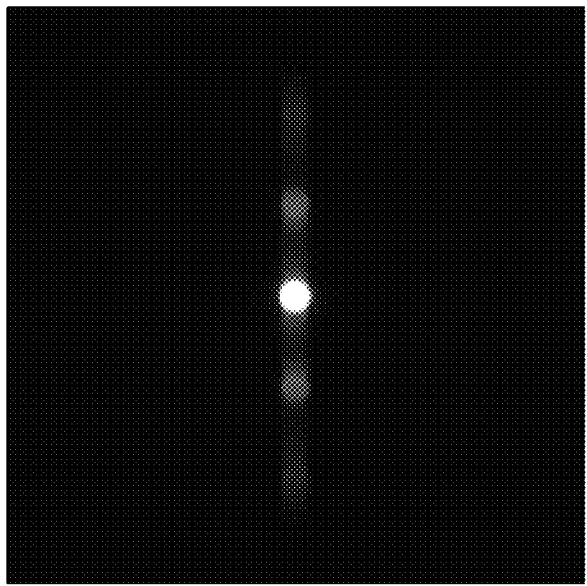
FIGS. 24B to 24D are photographs illustrating black visibility characteristics according to inclinations of light guide surfaces in light emitting display apparatuses according to some embodiments of the present disclosure.
Figure 24C:
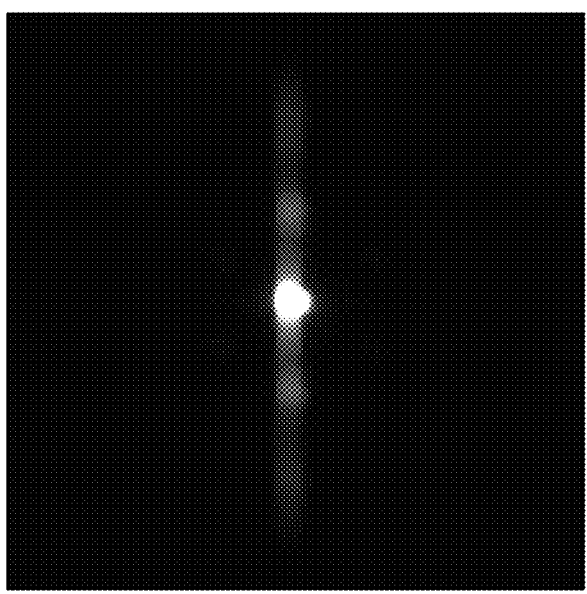
Figure 24D:
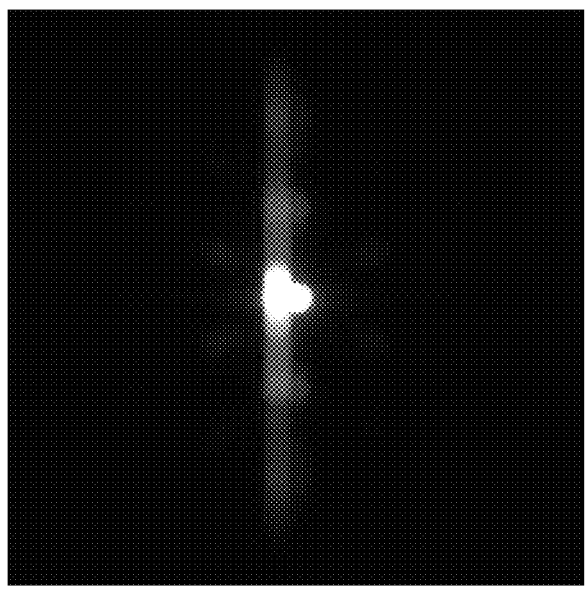
Figure 24E:
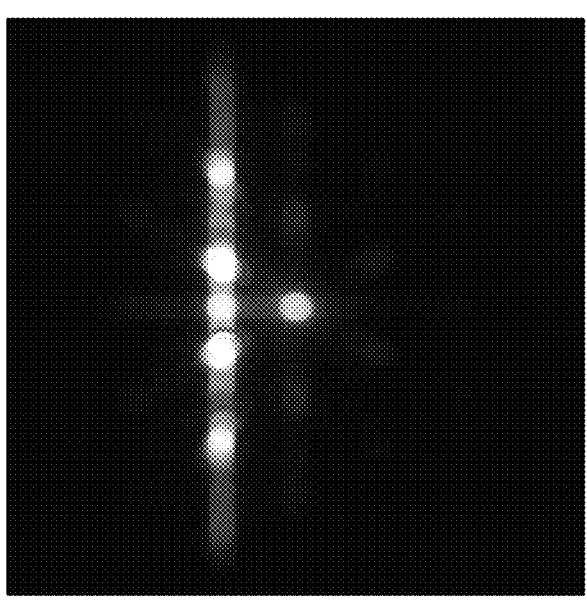
FIG. 24E is a photograph illustrating black visibility characteristics according to an inclination of a light guide surface according to a comparative example.

FIG. 24A is a photograph illustrating black visibility characteristics of the light emitting display apparatus according to the embodiment of the present disclosure shown in FIG. 2, FIGS. 24B to 24D are photographs illustrating black visibility characteristics according to inclinations of light guide surfaces in light emitting display apparatuses according to some embodiments of the present disclosure, and FIG. 24E is a photograph illustrating black visibility characteristics according to an inclination of a light guide surface according to a comparative example. FIGS. 24A to 24E are photographs each obtained after photographing a screen of a light emitting display apparatus at a distance of about 30 cm from the light emitting display apparatus in a state of emitting white light from the light emitting display apparatus. The brightest white area in each of FIGS. 24A to 24E is generated by a wavelength having a strongest intensity from among wavelengths of reflected light.

The light emitting display apparatus used in an experiment of FIG. 24A includes only a light extraction portion without including a light guide surface. The light emitting display apparatus used in an experiment of FIG. 24B includes a light guide surface formed at a buffer layer while overlapping, in common, with a plurality of subpixels in one pixel and having an inclination of 0.07°. The light emitting display apparatus used in an experiment of FIG. 24C includes a light guide surface formed at a protection layer while individually overlapping with each of a plurality of subpixels and having an inclination of 0.29°. The light emitting display apparatus used in an experiment of FIG. 24D includes a light guide surface formed at a protection layer while overlapping, in common, with a plurality of subpixels in one pixel and having an inclination of 0.72°. The light emitting display apparatus used in an experiment of FIG. 24E includes a light guide surface formed at a protection layer while individually overlapping with each of a plurality of subpixels and having an inclination of 2.9°.

It may be seen from FIG. 24A that, in a light emitting display apparatus according to an embodiment of the present disclosure, the rainbow pattern in the radial form is generated by light reflected by a light extraction portion disposed at a protection layer, thereby degrading black visibility characteristics.

It may be seen from FIGS. 24B to 24D that, in the light emitting display apparatus according to another embodiment of the present disclosure shown in FIG. 9, the rainbow pattern in the radial form generated by light reflected by a light extraction portion disposed at a protection layer is converted into a vertical line pattern through a blazed grating effect according to a light guide surface and, as such, generation of the rainbow pattern in the radial form is suppressed or minimized, thereby achieving an enhancement in black visibility characteristics.

It can be seen from FIG. 24E that, in a light emitting display apparatus according to a comparative example, although the rainbow pattern in the radial form generated by light reflected by a light extraction portion disposed at a protection layer is converted into a vertical line pattern through a blazed grating effect according to an inclination of a light guide surface, the vertical line pattern is generated, together with a radially-shaped rainbow pattern, in an area in which a diffraction path of light according to a high inclination of the light guide surface deviates from a center of the rainbow pattern in the radial form and, as such, a reflection diffraction pattern is generated through mixing of the vertical line pattern with the rainbow pattern in the radial form, thereby rather degrading black visibility characteristics.

Therefore, the inclination β of the light guide surface according to an embodiment of the present disclosure may be not less than 0.03°, but less than 2.9°, more preferably, 0.03 to 0.72°.

In addition, from a reflection diffraction pattern shown in each of FIGS. 24A to 24E, an average color difference between a brightest white area and peripheral reflected light generated therearound may be calculated. The average color difference of the reflection diffraction pattern shown in FIG. 24A was calculated to be about 7, the average color difference of the reflection diffraction pattern shown in FIG. 24B was calculated to be about 6.1, the average color difference of the reflection diffraction pattern shown in FIG. 24C was calculated to be about 6.1, the average color difference of the reflection diffraction pattern shown in FIG. 24D was calculated to be about 9.6, and the average color difference of the reflection diffraction pattern shown in FIG. 24E was calculated to be about 14.6. Accordingly, when the average color difference of the reflection diffraction pattern is taken into consideration, the inclination β of the light guide surface according to the embodiment of the present disclosure may be 0.03 to 0.29°.

Figure 25A:
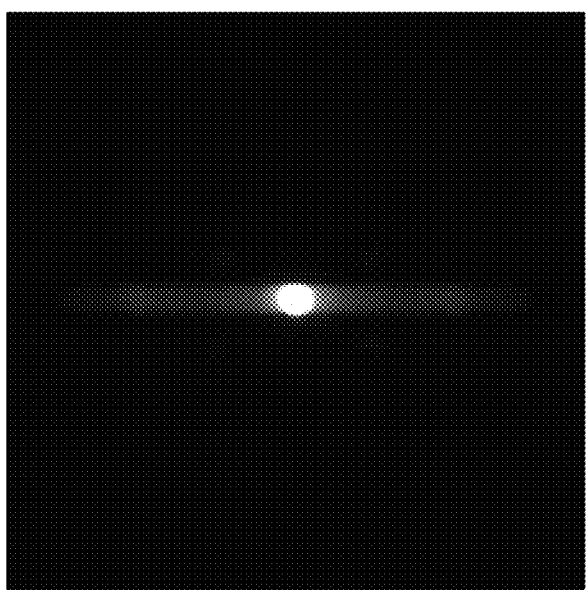
FIG. 25A is a photograph illustrating black visibility characteristics according to an inclination of a light guide surface in a light emitting display apparatus according to another embodiment of the present disclosure.
Figure 25B:
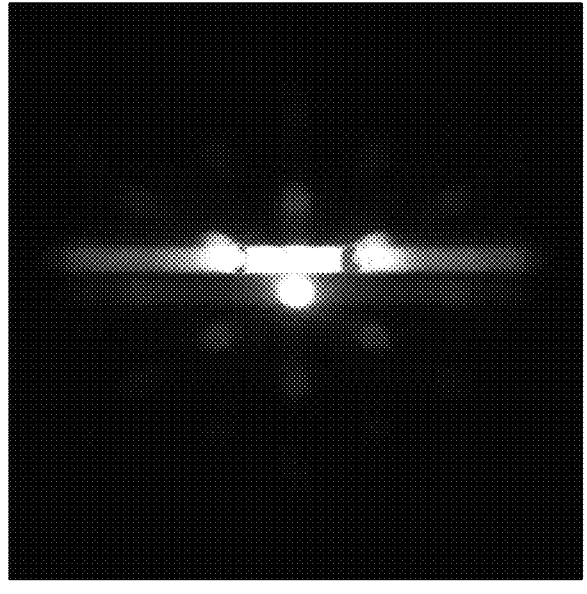
FIG. 25B is a photograph illustrating black visibility characteristics according to an inclination of a light guide surface according to a comparative example.

FIG. 25A is a photograph illustrating black visibility characteristics according to an inclination of a light guide surface in a light emitting display apparatus according to another embodiment of the present disclosure, and FIG. 25B is a photograph illustrating black visibility characteristics according to an inclination of a light guide surface according to a comparative example. FIGS. 25A and 25B are photographs each obtained after photographing a screen of a light emitting display apparatus at a distance of about 30 cm from the light emitting display apparatus in a state of emitting white light from the light emitting display apparatus. The brightest white area in each of FIGS. 25A and 25B is generated by a wavelength having a strongest intensity from among wavelengths of reflected light.

The light emitting display apparatus used in an experiment of FIG. 25A includes a light guide surface formed at a buffer layer while overlapping, in common, with a plurality of subpixels within one pixel and having an inclination of 0.13°. The light emitting display apparatus used in an experiment of FIG. 25B includes a light guide surface formed at a protection layer while overlapping, in common, with a plurality of subpixels within one pixel and having an inclination of 1.26°.

It may be seen from FIG. 25A that, in the light emitting display apparatus according to another embodiment of the present disclosure shown in FIGS. 19 to 21, a rainbow pattern in a radial form generated by light reflected by a light extraction portion disposed at a protection layer is converted into a horizontal line pattern through a blazed grating effect according to a light guide surface and, as such, generation of the rainbow pattern in the radial form is suppressed or minimized, thereby achieving an enhancement in black visibility characteristics.

It can be seen from FIG. 25B that, in a light emitting display apparatus according to a comparative example, although the rainbow pattern in the radial form generated by light reflected by a light extraction portion disposed at a protection layer is converted into a horizontal line pattern through a blazed grating effect according to an inclination of a light guide surface, the horizontal line pattern is generated, together with a radially-shaped rainbow pattern, in an area in which a diffraction path of light according to a high inclination of the light guide surface deviates from a center of the rainbow pattern in the radial form and, as such, a reflection diffraction pattern is generated through mixing of the vertical line pattern with the rainbow pattern in the radial form, thereby rather degrading black visibility characteristics.

Therefore, inclination β' of the light guide surface according to an embodiment of the present disclosure may be not less than 0.05°, but less than 1.26°, more preferably, 0.05 to 0.13°.

In addition, the average color difference of the reflection diffraction pattern shown in FIG. 25A was calculated to be about 5.8, and the average color difference of the reflection diffraction pattern shown in FIG. 25B was calculated to be about 12.1. Accordingly, when the average color difference of the reflection diffraction pattern is taken into consideration, the inclination β of the light guide surface according to the embodiment of the present disclosure may be 0.03 to 0.13°.

A light emitting display apparatus according to an embodiment of the present disclosure will be described below.

A light emitting display apparatus according to the present disclosure may comprise a substrate comprising a light emitting surface and a plurality of pixels having an emission area; a pixel circuit layer comprising a plurality of insulating layers over the substrate; a protection layer over the pixel circuit layer; a light extraction portion over the protection layer in the emission area, the light extraction portion comprising a plurality of concave portions and a convex portion between the plurality of concave portions; a light emitting device layer on the light extraction portion, the light emitting device layer configured to emit light to the light emitting surface; and a light guide surface at one of the plurality of insulating layers and the protection layer disposed at each of the plurality of pixels, the light guide surface may be inclined with respect to the light emitting surface while overlapping with the emission area.

According to some embodiments of the present disclosure, each of the plurality of pixels may comprises a plurality of subpixels, and the light guide surface may commonly overlap with respective emission areas of the plurality of subpixels within one pixel.

According to some embodiments of the present disclosure, the light guide surface may comprise a first end portion at a first side of each of the plurality of pixels, and a second end portion at second side of each of the plurality of pixels that is opposite the first side, and the first end portion and the second end portion of the light guide surface may be parallel to a second direction intersecting a first direction.

According to some embodiments of the present disclosure, the light guide surface may comprise a first end portion disposed, in common, at third sides of respective emission areas of the plurality of subpixels, and a second end portion commonly disposed at fourth sides that are opposite to the third sides of the respective emission areas of the plurality of subpixels, and the first end portion and the second end portion of the light guide surface may be parallel to a first direction intersecting a second direction.

According to some embodiments of the present disclosure, each of the plurality of pixels may comprise a plurality of subpixels, and the light guide surface may individually overlap with respective emission areas of the plurality of subpixels.

According to some embodiments of the present disclosure, the light guide surface may comprise a first end portion at a first side of the respective emission areas, and a second end portion at second side of the respective emission areas that is opposite the first side, and the first end portion and the second end portion of the light guide surface may be parallel to a second direction intersecting a first direction.

According to some embodiments of the present disclosure, the plurality of insulating layers may comprise a buffer layer over the substrate, a gate insulating layer over the buffer layer, an interlayer insulating layer over the gate insulating layer, and a passivation layer over the interlayer insulating layer, and the light guide surface may be at one of the buffer layer, the gate insulating layer, the interlayer insulating layer, and the passivation layer.

According to some embodiments of the present disclosure, the light guide surface may be at the protection layer, and the plurality of concave portions may be concave from the light guide surface.

According to some embodiments of the present disclosure, an inclination of the light guide surface with respect to the light emitting surface of the substrate satisfies a following Expression:

$$W \times \tan(\beta) \leq T, \qquad \text{[Expression]}$$

where, W may be a pixel width parallel to a first direction,
β may be an inclination of the light guide surface, and
T may be a thickness of the protection layer.

According to some embodiments of the present disclosure, a distance between the light emitting surface of the substrate and the light guide surface may gradually increase as the light guide surface extends from the first end portion to the second end portion, or may gradually increase as the light guide surface extends from the second end portion to the first end portion.

A light emitting display apparatus according to the present disclosure may comprise a substrate comprising a plurality of pixels and a light emitting surface, a light extraction portion over the substrate, the light extraction portion comprising a plurality of concave portions, and a convex portion between the plurality of concave portions, a light emitting device layer over the light extraction portion, the light emitting device layer comprising an emission layer and a light reflection surface, and a light guide surface between the light emitting surface and the light reflection surface, the light guide surface may be inclined with respect to the light emitting surface.

According to some embodiments of the present disclosure, the light guide surface may be at a path along which light emitted from the light emitting device layer is extracted to the light emitting surface.

According to some embodiments of the present disclosure, the light emitting display apparatus may further comprise a pixel circuit layer over the substrate, the pixel circuit layer comprising a plurality of insulating layers, and a protection layer between the pixel circuit layer and the light emitting device layer, the protection layer having the light extraction portion, and the light guide surface may be at one of the plurality of insulating layers and the protection layer.

According to some embodiments of the present disclosure, the light guide surface may be at the protection layer, and the plurality of concave portions may be concave from the light guide surface.

According to some embodiments of the present disclosure, the substrate may further comprise an inner surface that is opposite to the light emitting surface, and the light guide surface may be at the inner surface of the substrate.

According to some embodiments of the present disclosure, each of the plurality of pixels may comprise a plurality of subpixels, and the light guide surface may commonly overlap with respective emission areas of the plurality of subpixels within one pixel or individually overlaps with respective emission areas of the plurality of subpixels within one pixel.

According to some embodiments of the present disclosure, the light emitting display apparatus may further comprise a color filter layer at a path along which light emitted from the light emitting device layer is extracted to the light emitting surface.

According to some embodiments of the present disclosure, the light emitting device layer may further comprise a first electrode between the light extraction portion and the light emitting layer, and a second electrode over the light emitting layer, the second electrode may have the light reflection surface.

According to some embodiments of the present disclosure, the light guide surface may be a blazed grating.

According to some embodiments of the present disclosure, the light emitting display apparatus may further comprise a polarization member coupled to the light emitting surface of the substrate.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
a substrate comprising a light emitting surface and a plurality of pixels having an emission area, the plurality of pixels including a first pixel, a second pixel, and a third pixel, the second pixel disposed between and immediately adjacent to the first pixel and the third pixel, each of the first pixel, the second pixel, and the third pixel including a plurality of subpixels;
a pixel circuit layer comprising a plurality of insulating layers over the substrate;
a protection layer over the pixel circuit layer;
a light extraction portion formed at an upper surface of the protection layer in the emission area, the light extraction portion comprising a plurality of concave portions and a plurality of convex portions each formed between the plurality of concave portions;
a light emitting device layer on the light extraction portion, the light emitting device layer configured to emit light to the light emitting surface; and
a light guide surface at the protection layer disposed at each of the plurality of pixels, the light guide surface including:
a first step transitioning from a first height to a second height from a bottom surface of the protection layer and overlapping, in a plan view of the light emitting display apparatus, a first bank between the first pixel and the second pixel, the second height being non-zero and shorter than the first height, and
a second step transitioning from a third height to a fourth height from the bottom surface of the protection layer and overlapping, in the plan view of the light emitting display apparatus, a second bank between the second pixel and the third pixel, the fourth height being non-zero and shorter than the third height;
wherein the light guide surface is inclined with respect to the light emitting surface from the second height of the first step to the third height of the second step across the plurality of subpixels of the second pixel.

2. The light emitting display apparatus of claim 1, wherein the light guide surface commonly overlaps with respective emission areas of the plurality of subpixels within one pixel.

3. The light emitting display apparatus of claim 2, wherein the light guide surface comprises:
a first end portion at a first side of each of the plurality of pixels; and
a second end portion at second side of each of the plurality of pixels that is opposite the first side; and
the first end portion and the second end portion of the light guide surface are parallel to a second direction intersecting a first direction.

4. The light emitting display apparatus of claim 3, wherein a distance between the light emitting surface of the substrate and the light guide surface gradually increases as the light guide surface extends from the first end portion to the second end portion, or gradually increases as the light guide surface extends from the second end portion to the first end portion.

5. The light emitting display apparatus of claim 1, wherein the light guide surface is at the protection layer and the plurality of concave portions are concave away from the substrate.

6. The light emitting display apparatus of claim 5, wherein an inclination angle of the light guide surface with respect to the light emitting surface of the substrate satisfies a following Expression:

$$W \times \tan(\beta) \leq T$$

where, W is a pixel width parallel to a first direction, $\beta$ is the inclination angle of the light guide surface, and T is a thickness of the protection layer.

7. The light emitting display apparatus of claim 1, wherein an inclination of the light guide surface with respect to the light emitting surface is from 0.03° to 0.72°.

8. The light emitting display apparatus of claim 1, further comprising:

a third bank between the plurality of subpixels of one of the first pixel, second pixel, or third pixel; and data lines and a reference line disposed under the third bank.

9. A light emitting display apparatus comprising:

a substrate comprising a light emitting surface and a plurality of pixels, the plurality of pixels including a first pixel, a second pixel, and a third pixel, the second pixel disposed between and immediately adjacent to the first pixel and the third pixel, each of the first pixel, the second pixel, and the third pixel including a plurality of subpixels;

a light extraction portion over the substrate, the light extraction portion comprising a plurality of concave portions and a plurality of convex portions each formed between the plurality of concave portions;

a light emitting device layer over the light extraction portion, the light emitting device layer comprising light emitting layer and a light reflection surface; and a light guide surface at a layer between the light emitting surface and the light reflection surface, the light guide surface including:

a first step transitioning from a first height to a second height from a bottom surface of the layer and overlapping, in a plan view of the light emitting display apparatus, a first bank between the first pixel and the second pixel, the second height being non-zero and shorter than the first height, and a second step transitioning from a third height to a fourth height from the bottom surface of the layer and overlapping, in the plan view of the light emitting display apparatus, a second bank between the second pixel and the third pixel, the fourth height being non-zero and shorter than the third height, wherein the light guide surface is inclined with respect to the light emitting surface from the second height of the first step to the third height of the second step across the plurality of subpixels of the second pixel.

10. The light emitting display apparatus of claim 9, wherein the light guide surface is at a path along which light emitted from the light emitting device layer is extracted to the light emitting surface.

11. The light emitting display apparatus of claim 10, further comprising:

a pixel circuit layer over the substrate, the pixel circuit layer comprising a plurality of insulating layers; and a protection layer between the pixel circuit layer and the light emitting device layer, the protection layer having the light extraction portion, and wherein the layer is the protection layer.

12. The light emitting display apparatus of claim 11, wherein the light guide surface is at the protection layer and the plurality of concave portions are concave away from the substrate.

13. The light emitting display apparatus of claim 10, wherein the light guide surface commonly overlaps with respective emission areas of the plurality of subpixels within one pixel or individually overlaps with respective emission areas of the plurality of subpixels within one pixel.

14. The light emitting display apparatus of claim 10, further comprising:

a color filter layer at a path along which light emitted from the light emitting device layer is extracted to the light emitting surface.

15. The light emitting display apparatus of claim 9, wherein the light emitting device layer further comprises:

a first electrode between the light extraction portion and the light emitting layer; and a second electrode over the light emitting layer, the second electrode having the light reflection surface.

16. The light emitting display apparatus of claim 9, wherein the light guide surface is a blazed grating.

17. The light emitting display apparatus of claim 9, further comprising:

a polarization member coupled to the light emitting surface of the substrate.

18. The light emitting display apparatus of claim 9, wherein an inclination of the light guide surface with respect to the light emitting surface is from 0.03° to 0.72°.

19. The light emitting display apparatus of claim 9, further comprising:

a third bank between the plurality of subpixels of one of the first pixel, second pixel, or third pixel; and data lines and a reference line disposed under the third bank.

* * * * *